US006369738B1

(12) United States Patent
Swanson

(10) Patent No.: US 6,369,738 B1
(45) Date of Patent: Apr. 9, 2002

(54) TIME DOMAIN/FREQUENCY DOMAIN DATA CONVERTER WITH DATA READY FEATURE

(76) Inventor: Eric Swanson, 850 Jerry's La., Buda, TX (US) 78610

( * ) Notice: Subject to any disclaimer, the term of this patent is extended or adjusted under 35 U.S.C. 154(b) by 0 days.

(21) Appl. No.: 09/404,667

(22) Filed: Sep. 23, 1999

Related U.S. Application Data

(63) Continuation-in-part of application No. 09/376,761, filed on Aug. 17, 1999.

(51) Int. Cl.[7] .............................................. H03M 1/12
(52) U.S. Cl. .................. 341/155; 341/118; 341/161; 341/165; 341/114; 341/159; 341/156; 702/66; 702/74; 702/76; 702/77
(58) Field of Search ............................... 341/161, 165, 341/158, 114, 126, 142, 159, 64, 156, 118, 155; 375/242, 243, 244, 254, 340; 702/66, 74, 76, 77

(56) References Cited

U.S. PATENT DOCUMENTS

| 4,542,304 A | 9/1985 | Swanson | 307/353 |
| 4,570,080 A | 2/1986 | Swanson | 307/353 |
| 4,908,784 A | 3/1990 | Box et al. | 364/569 |
| 5,307,066 A | * 4/1994 | Kobayyashi | 341/155 |
| 5,343,201 A | * 8/1994 | Takayama et al. | 341/200 |
| 5,387,914 A | * 2/1995 | Mangelsdorf | 341/156 |
| 5,548,748 A | 8/1996 | Fuse | 395/550 |
| 5,686,918 A | * 11/1997 | Uda | 341/164 |
| 5,706,004 A | 1/1998 | Yeung | 341/122 |

OTHER PUBLICATIONS

Harris, Fredric J., On the Use of Windows for Harmonic Analysis with the Discrete Fourier Transform, Proceedings of the IEEE, vol. 66, No. 1, Jan. 1978.

* cited by examiner

Primary Examiner—Michael Tokar
Assistant Examiner—Lam T. Mai
(74) Attorney, Agent, or Firm—Howison, Chauza, Thoma, Handley & Arnott, LLP; Gregory M. Howison

(57) ABSTRACT

A time domain data converter with output frequency domain conversion. A data conversion circuit is operable to receive a signal in the time domain and provide an output in the frequency domain. It includes a data converter for converting data from an analog format to a digital format in the time domain. It also includes a processor for processing the data in the digital format output from the data converter through a time domain/frequency domain transform to provide data in the digital format in the frequency domain. The output of the frequency domain operation or the time domain operation can be provided for output in response to the generation of a data ready signal.

48 Claims, 13 Drawing Sheets

TIME DOMAIN/FREQUENCY DOMAIN DATA CONVERTER WITH DATA READY FEATURE

CROSS REFERENCE TO RELATED APPLICATION

This application is a Continuation-in-Part of pending U.S. patent application Ser. No. 09/376,761 entitled "TIME DOMAIN DATA CONVERTER WITH OUTPUT FREQUENCY DOMAIN CONVERSION," filed on Aug. 17, 1999.

TECHNICAL FIELD OF THE INVENTION

The present invention pertains in general to data converters and, more particularly, to a time domain data converter with the output thereof processed through a frequency domain transform to provide an output in the frequency domain.

BACKGROUND OF THE INVENTION

Conventional data converters provide either conversion from the analog domain to the digital domain in a typical analog-to-digital converter, or from the digital domain to an analog domain as a digital-to-analog converter. Typical analog-to-digital (A/D) converters of the delta sigma type provide some type of analog modulator for providing the initial data conversion, which is then followed by some type of filtering step. Conventionally, the filtering is performed in part in the digital domain. This requires some type of digital processing of the digital output of the modulator in the form of a digital filter such as a Finite Impulse Response (FIR) filter. However, the digital values output therefrom are values that exist in the time domain.

In some applications, it is desirable to determine information in the frequency domain after the conversion operation. Such applications as spectrum analyzers, for example, require such information. Therefore, the output of the data converter in the digital domain is then processed through some type of transform for converting time domain information to frequency domain information, this all completed in the digital domain.

The types of transform engines that are utilized to convert time domain information to digital domain information typically utilize some type of Fourier Transform, the most common being a Discrete Fourier Transform (DFT). The DFT is a one-to-one mapping of any finite sequence {y(r)}, r=0, 1, 2 ..., N−1 of N samples onto another sequence. This is defined by the following relationship:

$$Y(k) = \sum_{r=0}^{N-1} y(r) w_N^{rk}$$

where:

$$w_N \equiv e^{-j2\pi/N} = \cos\frac{2\pi}{N} - j\sin\frac{2\pi}{N}$$

In general, a DFT algorithm requires a plurality of multiplication/accumulation operations. To reduce the number of these multiplication/accumulations, a Fast Fourier Transform (FFT) can be implemented to provide a rapid means for computing a DFT with $N\log_2 N$ multiplies, which otherwise would have taken $N^2$ complex multiplications. Even with the reduction of the number of multiplications, there are still a large number of multiplication/accumulation operations that are required in order to calculate the time domain/frequency domain conversion. Conventionally, a Digital Signal Processor (DSP) is required which is typically a separate integrated circuit. As such, whenever providing for both a data conversion operation with an A/D converter, and a time domain/frequency domain conversion with a DSP, there are typically required two integrated circuits.

In general, there does not exist a commercial monolithic solution providing both the benefits of a data converter with that of a frequency domain converter such that an analog input can be received, converted to the digital domain and this digital value processed to provide a frequency domain output. In general, typical solutions utilize a data converter that provides a digital value in the time domain which is then input to a processor. This processor can be in the form of a microcontroller or a DSP. A data converter, due to its inherent construction, basically provides the ability to convert an analog input signal to a digital time domain output signal with a defined bit-resolution. This, of course, provides an output in the time domain. When processing this time domain signal to provide a frequency domain output, the processor is programmed to process some type of Discrete Fourier Transform or Fast Fourier Transform. Any type of algorithm that provides such a transform can be utilized. However, in order for a designer to utilize such a transform, this requires programming of the processor or microcontroller. Therefore, if an existing design must be upgraded to provide such a function or be required to process in the frequency domain, then a more complex DSP or microcontroller must be utilized. This is due to the fact that any processing in the frequency domain requires a more complex processing capability. The result is that an upgrade to a frequency domain solution from a time domain solution will probably require the designer to change his design to incorporate a much more complex processing section, in addition to also requiring a significant amount of programming of that processing section, this programming being the most expensive aspect of such an upgrade. It is desirable to utilize the pre-upgrade processing section, which is typically a relatively simple processor, and merely upgrade the data converter. However, the mere change of a design to process in the frequency domain as opposed to the time domain will necessitate additional processing capability and programming.

SUMMARY OF THE INVENTION

The present invention disclosed and claimed herein comprises a data conversion circuit for converting data from an analog input value to a digital value. The data converter includes a time domain processor for receiving the analog input value and generating a digital value representative thereof in the time domain. A frequency domain processor is provided for receiving the output of the time domain processor and processing the time domain information therefrom through a predetermined time domain/frequency domain algorithm to output frequency domain information representative of the output of the time domain processor in the frequency domain in accordance with the algorithm. An input/output interface is operable to interface the output of at least the frequency domain processor for external access thereto. A controller generates data-ready signal when data is generated by the frequency domain processor to indicate to a user that data can be retrieved from the input/output interface.

In another aspect of the present invention, the data converter includes a time domain data converter for receiving the analog input, and converting the received analog input to a digital value, for a given sampled value of the received analog input value. A time domain input/output interface is provided for interfacing the output of the time domain converter for external access thereto. A background frequency domain processor is provided for receiving a plurality of successive outputs of the time domain data converter for processing with a predetermined time domain/frequency domain algorithm to provide frequency domain information relating to the successive outputs of the time domain data converter processed.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
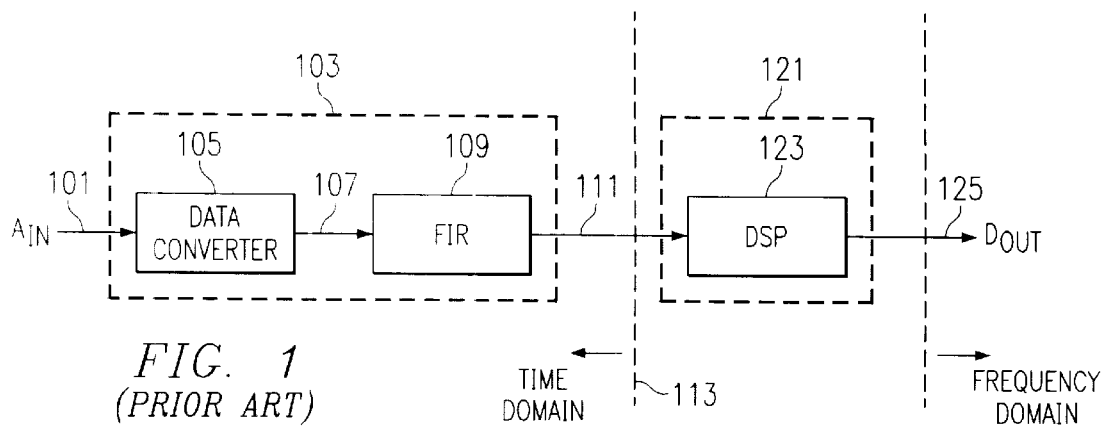
FIG. 1 illustrates a prior art representation of a two chip converter and a time domain/frequency domain conversion operation.

Referring now to FIG. 1, there is illustrated a block diagram of a prior art solution for receiving an analog signal, converting it to a digital domain signal, all in the time domain, and then converting it to the frequency domain to obtain frequency information therefrom. The analog signal $A_{IN}$ was received on an input 101 which is input to a first integrated circuit (IC) 103. The IC 103 is a basic analog-to-digital (A/D) converter. This is typically comprised of a data converter 105 which is operable to receive the analog input signal on the line 101, sample this signal at a predetermined sampling rate and convert each of the samples to a digital output value at the sampling rate. This data converter 105 can by any type of data converter such as a delta sigma converter, a successive approximation register (SAR) converter, or similar converter. This provides output digital values on a line 107 in the digital domain. This can then be processed by subsequent digital circuitry in a block 109, which block 109 illustrates a filter operation in the form of a Finite Impulse Response (FIR) filter, by way of example only. This provides an overall output from the IC 103 on a line 111 that is a stream of digital values.

Typically, the data converter 105 provides a multi-bit output with a defined data width. This is then input to the filter 109 which will typically operate at a higher data width. For example, the output of the data converter 105 may be a 12-bit output whereas the filter 109 processes in a 16-bit, or 32-bit data width. This will preserve the dynamic range of the initial A/D conversion. The filter 109 may then truncate the digital output values and then this output provided on a serial output by processing it through a parallel/serial converter (not shown). This, again, represents processing in the time domain, illustrated to the left of a phantom line 113.

The output of the IC 103 is input to an IC 121, which is basically comprised of a DSP engine 123. This DSP engine is operable to perform a pre-determined transform on the data to convert the digital data output by the IC 103 into frequency domain information on a digital output 125. Typically, although not limiting, this utilizes a DFT transform. This type of transform will require a finite number of samples within a block to glean the frequency information, with each block having a set size and starting point.

Figure 2:
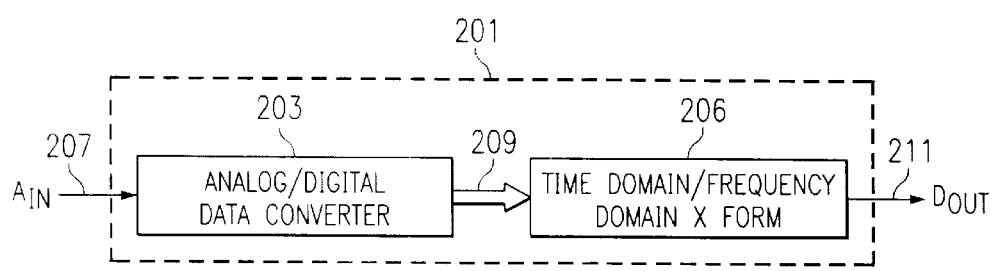
FIG. 2 illustrates an overall diagrammatic view of a monolithic solution in accordance with the present disclosure.

Referring now to FIG. 2 there is illustrated a block diagram of the integrated circuit of the present disclosure. However, it should be understood that, although this is referred to as an integrated circuit, it can be any monolithic solution wherein the combination of a data converter for converting information from one format to another format in a time domain is then processed through a transform to the frequency domain. In the present disclosure the overall conversion/conversion process is contained within an integrated circuit 201. The integrated circuit 201, as noted herein, is a monolithic solution that allows a data converter circuit 203 and a time domain/frequency transform block 206 in the form of a transform engine to be disposed on a single monolithic chip. The data converter 203, in the disclosed embodiment, is an analog/digital data converter. The data converter 203 receives an analog input from analog signal $A_{IN}$ on a line 207, samples the signal and converts this to digital values in the time domain for output on a bus 209. This is then input to the transform block 206 for conversion to the frequency domain and the frequency content information in the form of digital values. These digital values are output on an output 211, referred to as the output $D_{OUT}$. This, in the disclosed embodiment, is a serial output such that some type of parallel/serial conversion is required.

In general, by incorporating both the data conversion operation and the frequency domain transformation circuit in the same monolithic circuit, a single measurement module is provided wherein the functions of a data converter and a processing circuit are incorporated into a single monolithic solution, which processing circuit can incorporate the functions that are normally associated with DFT-type calculations. As will be described hereinbelow, this is facilitated without requiring the full capability of a DSP.

Figure 3:
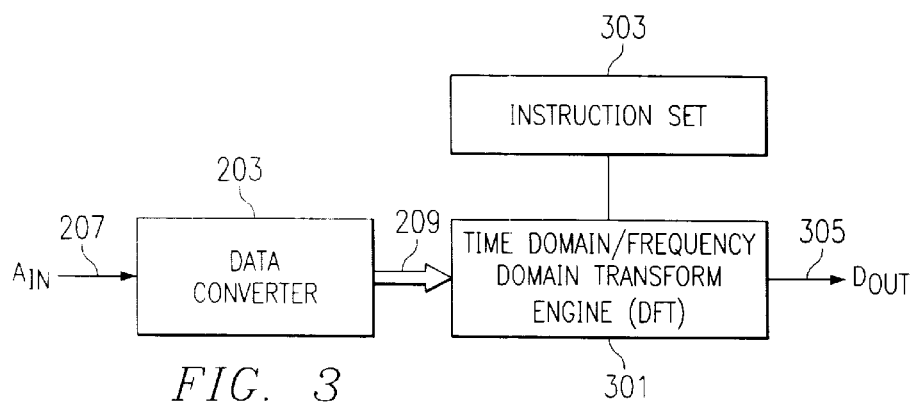
FIG. 3 illustrates a block diagram of the data converter and the TD/FD transform engine.

Referring now to FIG. 3, there is illustrated a block diagram of the basic operation of integrated circuit 202. The data converter 203 receives the input signal on line 207 and then converts it to sampled digital output values on the bus 209. This data converter can be realized with a delta-sigma converter, a SAR converter or similar type converter which will provide on the output thereof a sequence of digital words. These digital words are then received by a TD/FD transform engine 301 which is operable to perform DFT calculations. This DFT calculation is typically performed on a block of N input samples at a user specified or hardware specified block start time. Typically, transform engine 301 will require some type of instruction set in a block 303, which instruction set provides the information required by the transform engine 301 to perform the various calculations. Typically, this instruction set is separate from the engine 301, but it can be integrated into the transform 301 in the form of a hardware operation. The transform engine 301 typically operates at a different speed than the data converter 203, since the data converter 203 typically operates under the control of a sample clock at a sampling frequency $f_S$. The data converter 203 provides data at the sampling rate of the sample clock to the transform engine 301 for processing thereof at the processing speed of the transform engine 301. The transform engine 301 will typically provide an output therefrom a finite time after receiving the sampled data from the output of the converter 203. This can therefore result in some delay between the sampled data received from the converter 203 on bus 209 and the frequency domain data output from the transform engine 301 on a data output line 305. It is noted that the transform engine 301 need not be synchronized with the sample clock; rather, the only requirement is that a block of N samples be processed.

Figure 4:
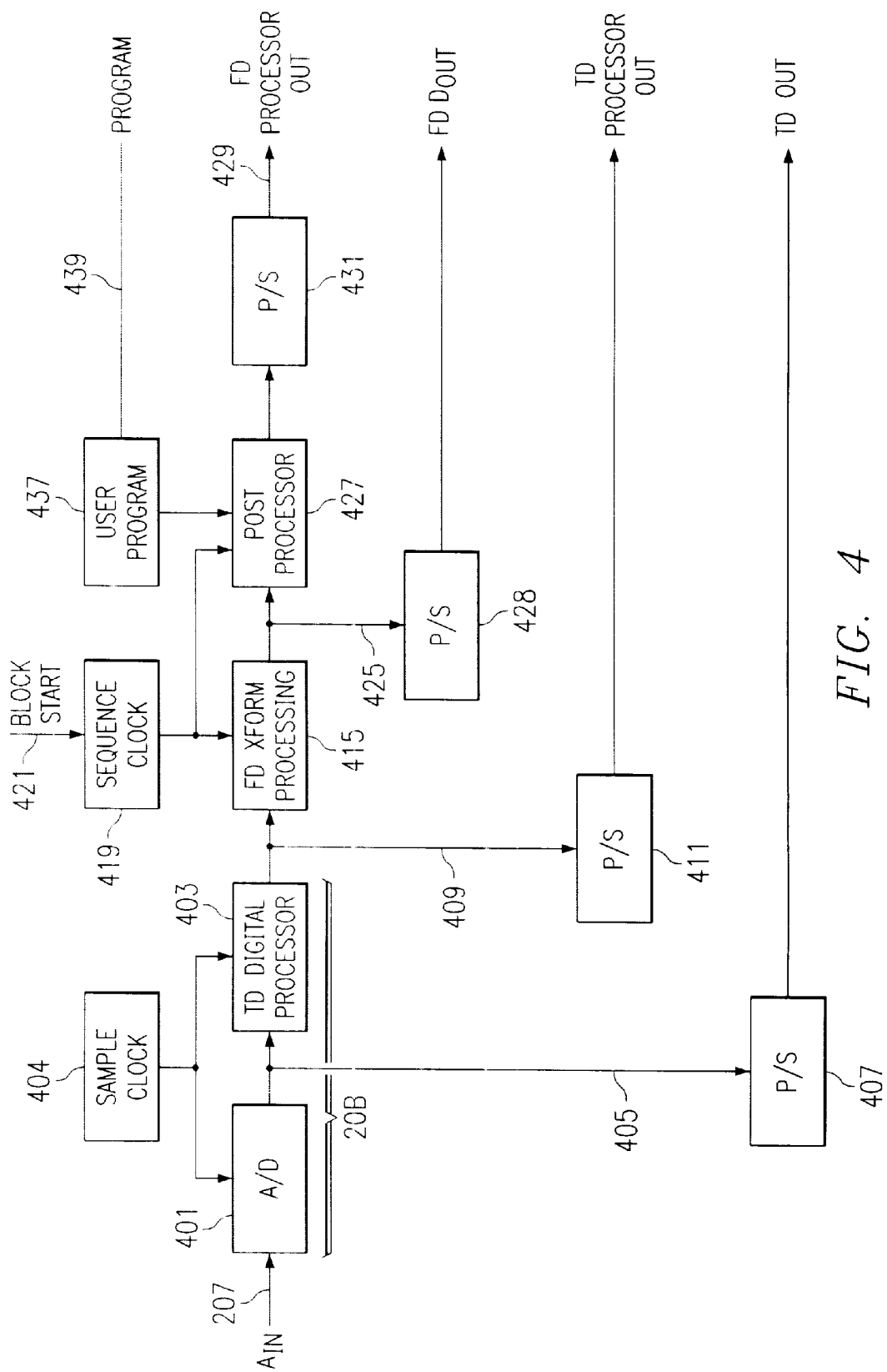
FIG. 4 illustrates a more detailed block diagram of the integrated circuit of the present disclosure.

Referring now to FIG. 4, there is illustrated a more detailed block diagram of the integrated circuit of the present disclosure. The analog input signal received on the analog input 207 is input to the data converter represented by data conversion section 203. This data conversion block 203 is represented by an analog/digital converter 401 which is operable to provide the basic conversion of an analog signal to a digital signal. Once converted to sampled digital signals, this sampled digital signal can then be processed in the time domain. This processing is represented by a block 403 which can be any type of digital processing. This digital processing, for example, could be filtering in the form of a filter, as described hereinabove with respect to FIG. 1. Alternatively, it could be any type of digital processing that is required to be performed in the time domain as a precursor to the frequency domain transform process. For example, windowing techniques can be utilized to avoid spectral leakage problems. This is defined in Frederic J. Harris, "On the Use of Windows for Harmonic Analysis with the Discrete Fourier Transform," Proc. IEEE, Vol. 66, No. 1, January 1978, pp 51–83. The A/D converter and the time domain digital processing section 403 are referred to a sample clock 404. This sample clock generates the clock signal $f_S$. which is utilized for the sampling operation, wherein the input analog signal $A_{IN}$ is sampled and converted to a digital signal, there being one digital output for each sample. The processing of the digital processing section 403 then operates on each of these samples.

The output of the A/D converter 201 can be output on a bus 405 to a parallel/serial converter 407 to provide a time domain output from A/D converter 201. The output of the processing section of the time domain digital processing section 403 is provided on the output of a bus 409 to a parallel/serial converter 411 to provide a processed time domain output. Again, this processing can be either mere filtering, some type of pre-processing in the time domain for the frequency domain transform process or a combination thereof.

Once the time domain information has been processed, it is output on the bus 409 to the input of a frequency domain transform process engine 415, which is substantially the same as engine 301. The frequency domain transform process engine 415 receives each of the digital sampled outputs in the time domain on bus 409 from the converter section 203. A sequence clock 419 is provided for controlling the operation of the frequency domain transform operation. With some transform algorithms, the data input thereto may have to be stored in some type of elastic storage device. The sequence clock 419 basically determines in what sequence the various multiplications and accumulations are to be carried out for the DFT algorithm or even the DFT operation. The DFT operation, as described hereinabove, operates on a block of samples. For example, the resolution of the DFT is the ratio of sampling frequency $f_S$, to the number of samples N. If the sampling frequency were 100 kHz and the number of samples N were equal to 1024, then the frequency resolution would be approximately 100 Hz. For this resolution, it would be required that 1024 samples be processed in a given block to provide the frequency information regarding those 1024 samples. This would provide frequency information for each 100 Hz increment or "frequency bin." The sequence clock requires some type of block start signal in the form of an input on an input line 421 which defines the start of the block, and the sequence clock 419 having knowledge as to the number of samples in the block. This is different than the requirement for the converter section 203, in that converter section 203 does not require any information as to the number of samples in the block.

Typically, the DFT algorithm will operate on a block of samples which will then provide frequency information in various "bins." These frequency bins are generated such that one is generated for each input sample output from the data converter 203, this being described in more detail hereinbelow. However, as also described hereinbelow, it is not necessary to output all of the information stored in the frequency bins which is generally calculated by the DFT algorithm. This will be the result of some post processing operation.

The output of the transform processor engine 415, which is comprised of the frequency information in the various bins, is output on a bus 425 and can be input to a parallel/serial converter 428 for direct output thereof as a serial digital value. This therefore provides serial output information as to the various binned information. Typically, this can be an addressable location, as will be described hereinbelow. The bus 425 is also input to a post processor 427, which post processor 427 can perform certain operations on the binned information output by the transform processor 415. This will provide frequency domain process output information on an output 429 through a parallel/serial converter 431.

The post processor 427 allows a user to basically perform certain operations on the binned frequency information. For example, it may be that all the information required by the user is merely magnitude information from a few bins. In situations where the input/output (I/O) bandwidth is a concern, calculating, post processing, and outputting only a subset of the total number of frequency bins may be desirable. This can be programmable through the user program block 437 which receives an external program signal on a line 439 or the programming can be provided at a mask level. As such, binned information can be processed to provide less than all the binned information output therefrom. This is advantageous in that it may not be necessary to perform all the calculations necessary for complete analysis of the frequency content. For example, it may be that all the information that is required by the user is merely magnitude information from a few bins.

Although the time domain processor 403, the transform block 415 and the post processor 427 have been disclosed as utilizing separate processing engines, two or all of these functions could be performed by a single processing engine.

Figure 5:
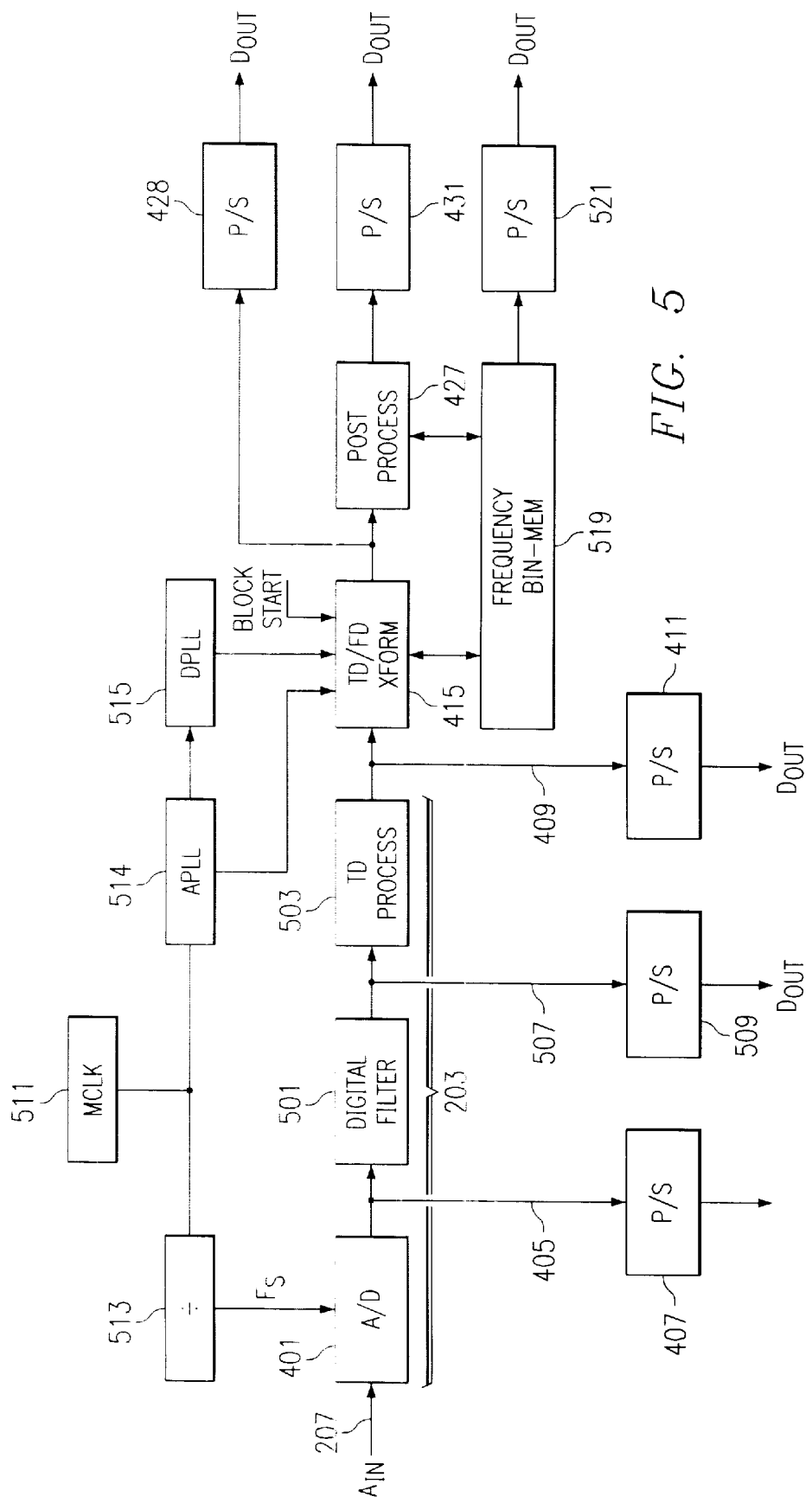
FIG. 5 illustrates a detailed block diagram of the present disclosure illustrating the various input/outputs at the post processing operation.

Referring now to FIG. 5, there is illustrated an even more detailed block diagram of the integrated circuit of the present disclosure. In this embodiment, the digital processing section 203 is comprised of A/D converter 401, which has the output thereof input to a digital filter section 501, the output of the digital filter section input to a time domain processing section 503. The digital filter section 503 is basically associated with the A/D converter section 401 in that it provides filtering in the time domain. The time domain processing section 503 is primarily a pre-processing section for pre-processing the digital data input to the frequency domain transform block 415. The output of the digital filtering section 501 can be provided as a separate output from a bus 507 to a parallel/serial converter 509 to provide a digital output of the partially processed time domain information in the digital domain.

The timing information is generally provided by a master clock 511 which is operable to generate a master clock signal. This can be divided by divide circuit 513 to provide a sampling frequency $f_S$. However, the sequencing operation provided by the transform block 415 is not necessarily synchronized with the sampling clock. As such, an analog phase lock loop (APLL) 514 is provided to give a multiply operation and scale the master clock up in frequency, followed by a digital phase lock loop (DPLL) 515 which is provided for functions such as digital noise management. Again, there is a block start operation that must be provided for the transform block 415.

The frequency domain output of the transform operation can be stored in frequency bins 519 which are addressable locations in the integrated circuit. These can be directly output through a parallel/serial converter 521, which basically allows for addressable selection thereof, the addressing operation not illustrated. The output of the transform block 415 is input to the post processor section 427 to allow direct post processing thereof, with the results thereof storable in the memory 519. Alternately, each of the binned values stored in memory by the transform block can be input to the post processing section 427 for processing thereof, the output thereof input to a parallel/serial converter 431. This post processing section 427, since all of the frequency information is collected and stored in the bins, can process any amount of this information to provide an output in accordance with a pre-determined post processing algorithm. It is noted that this post processing algorithm need not require all the frequency bin information to be stored. As such, this will reduce the amount of storage required, and also possibly reduce the amount of processing required by the transform block 415.

Since the entire string of processing for the time domain and the frequency domain is contained on a single integrated circuit chip, this removes the requirement for an I/O interface between two chips. As such, it can be seen that the various bus widths can be increased internal to the chip and then decreased or truncated for output therefrom. For example, the A/D converter could be realized with a SAR to provide a 12-bit output. The digital filter section 501, in order to maintain the resolution of A/D converter 401, could be operated at 16-bits to provide on the output there of a 16-bit output on bus 507. This 16-bit output could then be processed through a time domain process block 503 which could process at the 16-bit data width or even wider. This same 16-bit output or wider data width could be output on the bus 409 to the transform block 415 without requiring any truncation or subsequent processing to account for I/O considerations. This direct output can be input to the transform block 415, which in and of itself could require wider data paths for the processing. This data path can be output directly into the frequency bins or be truncated before input to the frequency bin. This, in general, will allow the system to maintain the wider internal bus width and maintain the data resolution of the A/D converter 401.

Figure 5A:
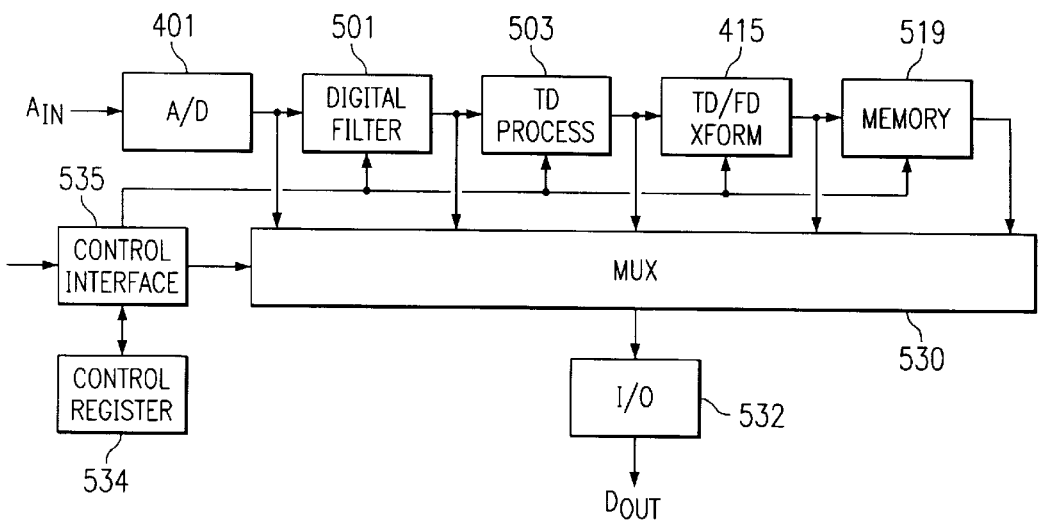
FIG. 5a illustrates an alternate embodiment with a multiplexer.

Referring now to FIG. 5a, there is illustrated an alternate embodiment of FIG. 5 wherein a multiplexer 530 is provided. The multiplexer 530 is operable to receive the output of each of the process blocks, the A/D converter 401, the digital filter 501, the timing domain processor 503, the TD/FD transform block 415 and the memory 519. These outputs are input to the multiplexer 530, one of which is selected for processing through an output interface block 532 to provide a single pin output. Therefore, with a chip having a single analog input and a single digital output, various processing functions can be provided with the output representing values in the time or frequency domains. This can be, of course, for the purpose of selective processing, or it could be for the purpose of diagnostics. This diagnostic mode would allow the user to determine process information at each stage of the process.

In order to control the overall operation of the frequency domain integrated circuit described hereinabove, a control interface 535 is provided. The control interface 535 is interfaced with a multiplexer 530 and all of remaining blocks in the system, the digital filter 501, the time domain processor 503 and the TD/FD transform block 415, in addition to the memory 519. In general, the control interface 535 allows the user a single port or pin by which to control various aspects of the system. A control register 534 is provided which is interfaced with the control interface 535 for storing control parameters that are associated with the operation of the integrated circuit. This allows a user to both provide commands through the line 536 to control the operation thereof and also allows data to be downloaded to the control register 534 or extracted from the control register 534. This control interface 535 therefore provides a "common control interface" for the overall chip in the form of the data converter portion for providing digital data in the time domain and the frequency domain translator portion. This is to be compared to previous systems that require multiple chips and separate control interfaces therefore. As such, less control pins will be required for a totally integrated solution by utilizing a common control interface. Only one interface is required in addition to the user only requiring to have knowledge as how to interface with this single interface.

Figure 5B:
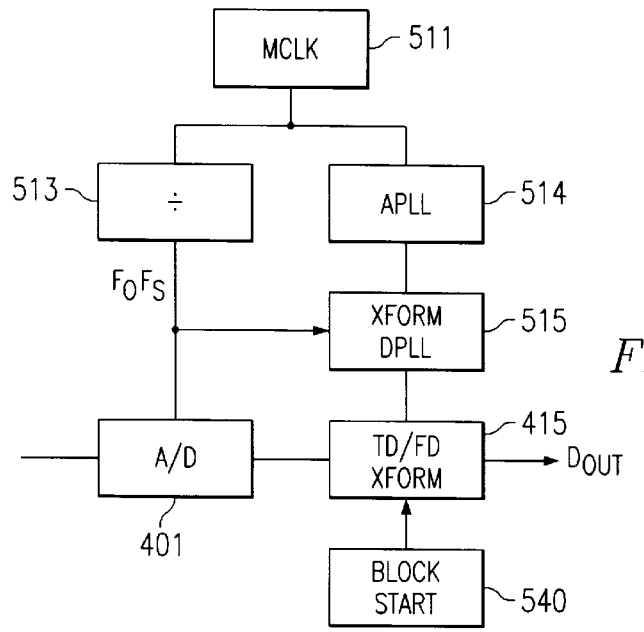
FIG. 5b illustrates a detail of the timing operation.

Referring now to FIG. 5b, there is illustrated a more detailed block diagram of a clocking operation. In general, the master clock 511 provides an output at a defined frequency period. Typically, this is a crystal controlled output. Since it is crystal controlled, designers would prefer to use a relatively inexpensive and easily obtainable crystal. This results in a relatively low frequency crystal. Since the digital processing operation is performed at a substantially higher clock rate than that associated with conventionally available crystals, the master clock frequency at block 511 will be multiplied with the use of an analog phase lock loop (APLL) 514. To allow for some digital domain "quiet time" immediately prior to analog sampling, the DPLL 515 will be utilized to provide a digital transform clock to the transform block 415. In addition to the transform clock, as described hereinabove, there is required a block start operation, as indicated by a block 540. This will be described hereinbelow.

Figure 6:
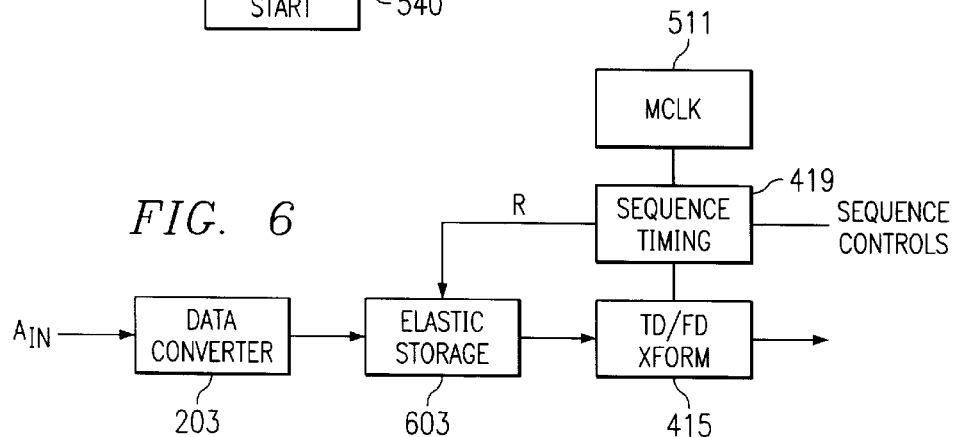
FIG. 6 illustrates a simple block diagram showing the elastic storage interface between the A/D converter and TD/FD transform block.

Referring now to FIG. 6, there is illustrated a block diagram of an example interface between the data conversion section 203 and the transform block 415. This is in the form of an elastic storage device 603. This elastic storage device 603 requires the data to be sampled at the sample rate of the sample clock $f_S$ in data conversion section 203. The actual calculation or sequencing of the transform block 415 is not necessarily synchronized with the sample clock. However, it is noted that the number of output values is less than or equal to the number of samples input for a given block size. If the block size, for example, were 1024, then there would be 1024 outputs provided, this being the resolution of the DFT algorithm. However, the data is not necessarily required by the transform block 415 at uniform intervals, and therefore, the elastic storage block 603 will be required. This elastic storage block 603 will be controlled by the sequence clock 419 which will generate a Read signal for the storage block 603 for input into the transform block 415. It is noted that the elastic store of FIG. 6 can be located anywhere within the process chain. It could be part of transform block 415 or part of any of the previous time domain processing sections in the chain. Further, some elastic storage can be provided on the output of the transform block 415.

Figure 7:
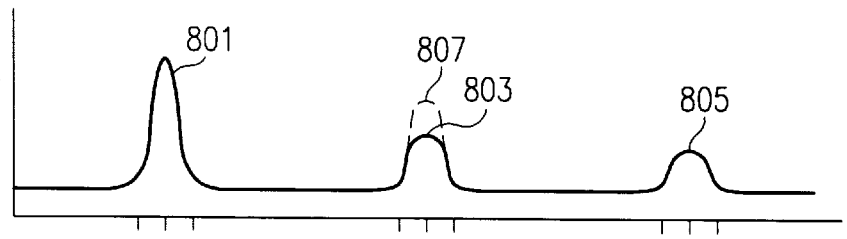
FIG. 7 illustrates an application of the TD/FD transform operation.

Referring now to FIG. 7, there is illustrated a plot of the frequency output for a given application, such as measurements of a rotating system. The rotating system has a fundamental operating frequency 801 which would represent the resolutions per minute (RPM). This would also have harmonics, a second harmonic 803 and third harmonic 805 and subsequent harmonics thereafter (not shown). It may be that a distortion would be desirable to measure (as an example of bearing wear, for example) or even a variation in the fundamental frequency. From a distortion standpoint, all that will be required would be to look at the relative amplitude of one of the harmonics. In the frequency domain, this is a relatively easy thing to do in that the second harmonic 803 can be measured over time and then the magnitude thereof compared with the previous magnitude. If there is a change in the magnitude, this would indicate some type of distortion. This would be virtually impossible to detect in the time domain, as very small changes are difficult to measure from a distortion standpoint, whereas the frequency domain facilitates such a measurement. This would be illustrated as a change in the output of the second harmonic, illustrated by phantom line 807.

Figure 8:
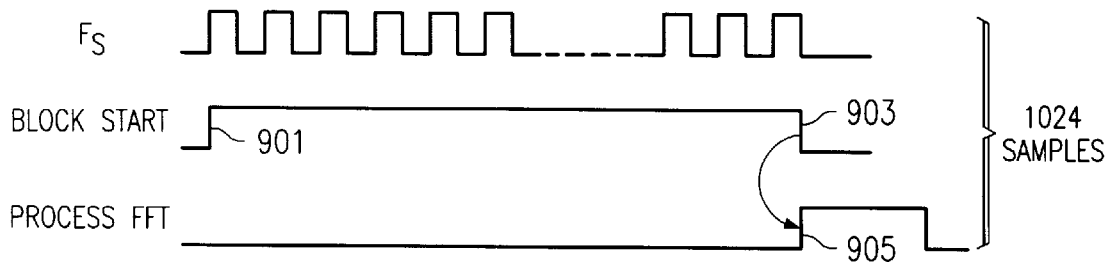
FIG. 8 illustrates a diagrammatic view of the block start signal and the sampling frequency.

Referring now to FIG. 8, there is illustrated a timing diagram illustrating the sampling frequency and the block operation. As described hereinabove, the transform operation requires N samples over which the transform is performed, i.e., there is a block of samples required to perform the transform. There is illustrated the sampling clock $f_S$ which basically provides for a predetermined number of N samples—in this example 1024 samples. A block start is initiated at an edge 901 and proceeds to an edge 902 which basically collects the samples. Different frequency domain transforms facilitate situations wherein certain of the calculations required thereby can be performed concurrently with the sample gathering for a given block of samples, i.e., prior to the time that all the samples are gathered for the given block. Thus, different transform algorithms may yield different amounts of pipelined delay before the frequency domain results are available.

The transforms described hereinabove were the DFT and the FFT transforms. However, there were many other transforms that can be utilized in transforming a time domain value to a frequency domain value. These transforms can result in significantly less calculations. For example, the Goertzel transform is a transform that allows the transform to be carried out for a single bin with a relatively simplistic algorithm. This requires a very small number of clock cycles in order to perform this operation. This algorithm is described in Goertzel, "An Algorithm for the Evaluation of Finite Trigonometric Series," American Math Monthly, 65, pp. 34–35, January 1958, which reference is incorporated herein by reference. Therefore, if only the information for a single bin were required, the Goertzel algorithm would be sufficient and this algorithm could easily be facilitated in a hardware application. Further, since the Goertzel algorithm is relatively straight forward, it would be relatively easy to change to a different bin number.

Figure 9:
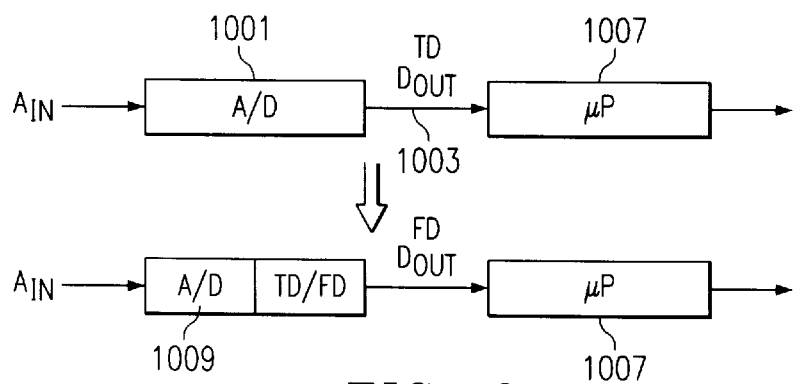
FIG. 9 illustrates a diagrammatic view of an upgrade operation.

Referring now to FIG. 9, there is illustrated an overall system operation wherein a prior art system is upgraded to the current apparatus. In the prior system, a time domain data converter 1001 is provided for converting an analog input value to a time domain digital output value on a line 1003. This is received by a microprocessor 1007. In a situation where a designer wanted to process information in the frequency domain or make decisions in the frequency domain, this would then require the microprocessor to receive the time domain digital output and apply additional processing thereto. Typically, in an application wherein the time domain digital output were processed, this would require significantly more processing power, the significantly more processing power (and/or programming) required to perform some type of transform from the time domain to the digital domain. By upgrading the system to a data converter 1009 having the ability to provide the data conversion in the time domain and then convert the information to the frequency domain, the frequency domain output can then be utilized for processing with the same microprocessor 1007. The instructions required therefor would be minimal to upgrade the operation. Therefore, by utilizing the device of the present disclosure, frequency domain processing can be provided without requiring any upgrade in the processing section. This will be desirable from a designer standpoint in that the complexity of programming the microprocessor 1007 would, in and of itself, facilitate a much nicer design.

Figure 10:
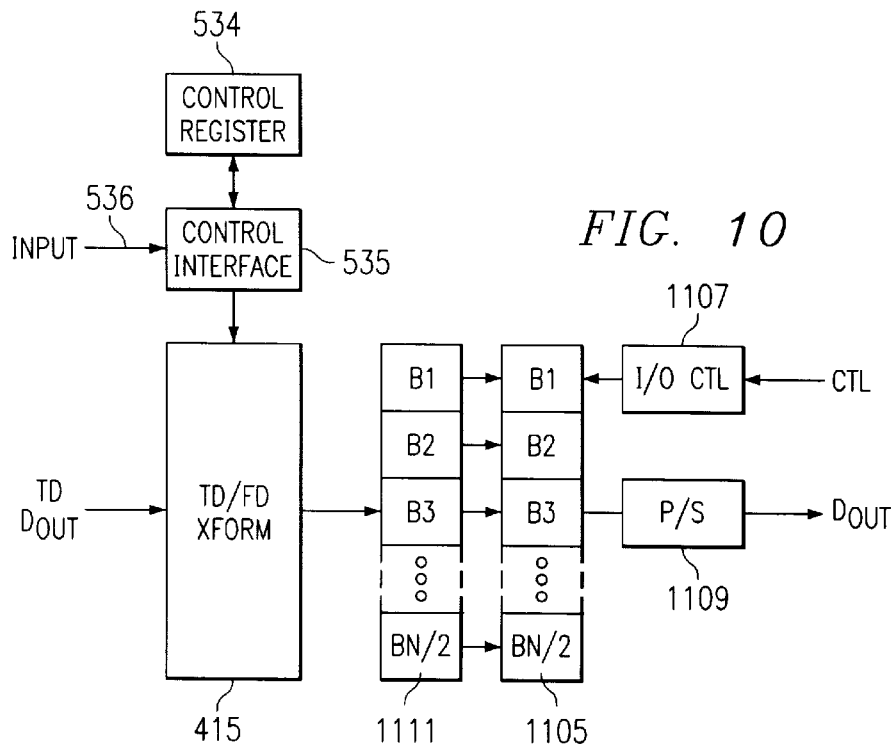
FIG. 10 illustrates a block diagram of the user programmable operation of the time domain/frequency domain transform block 415.

Referring now to FIG. 10, there is illustrated a block diagram of the configure operation wherein the user can program the operation of the transform block 415. In general, the transform block 415 will be a processing unit that will perform calculations in accordance with the predetermined frequency domain transform algorithm. However, there are some parameters that can be applied to the transform to alter the operation thereof. For example, in the Goertzel transform, there can be some type of address shift such that the particular bin that is calculated is definable by the user. This is facilitated through the use of the configuration interface 535 which can receive input information on line 536. This allows the user to externally input certain configuration information. This provides a more versatile system.

The output of the transform block 415 can then be input to one of multiple bins 1105. It may be that the integrated circuit is designed to only perform calculations for association with certain bins or provide all N/2 bins, each bin storing a real and imaginary part. If multiple bins are provided, there is some type of addressing that is required which is provided by an input/output control block 1107. This receives a control signal external to the system to select a bin for output therefrom. Further, there could be a situation wherein the bins are sequentially output and the control block 1107 would control such output. These are then processed through a parallel/serial block 1109 and then provide a serial output. This type of output is conventional. Typically, whenever dealing with this type of storage, there would typically be provided two memory storage locations, one for the output bins 1105 and an additional block 1111 for the accumulation operation. In general, each of the bins must be subject to an accumulation operation during the processing and then the final output latched over into the bin memories 1105.

Figure 11:
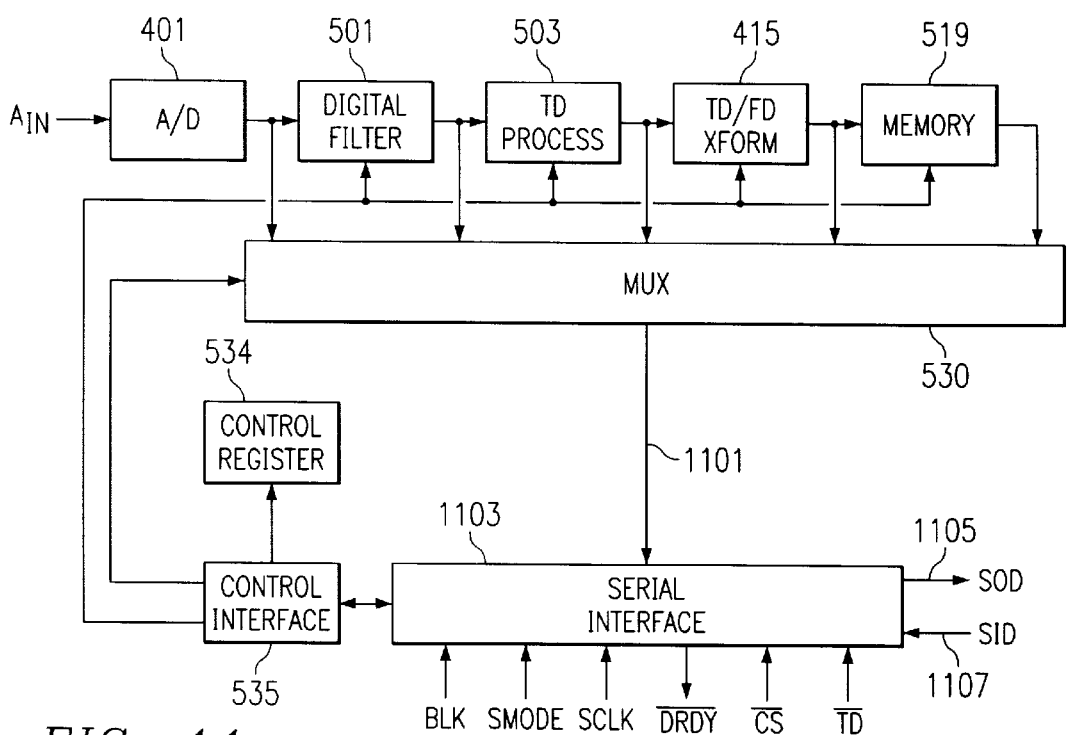
FIG. 11 illustrates a block diagram of an embodiment utilizing a serial interface and the data-ready feature.

Referring now to FIG. 11, there is illustrated an alternative embodiment of the above-disclosed time domain/frequency domain converter of FIG. 5a, wherein like numerals refer to like parts in the various FIGS. As described hereinabove, the multiplexer is operable to select the output form of the multiple processing sections, the A/D converter section 401, the digital filter section 501, the time domain processing section 503, the TD/FD transform section 415 or the memory section 519 and provide a single output on a line 1101. This, with reference to FIG. 5a, is output to the I/O block 532 in order to provide a digital output. In the embodiment of FIG. 11, this output line 1101 is input to a serial interface block 1103. The serial interface block 1103 basically functions as the I/O block 532 except that the serial interface block 1103 provides for a data-ready-Bar (DRDYb) signal and associated operation, as will be described hereinbelow. The serial interface block 1103 also provides the ability to receive the block start signal (BLK), a serial mode signal (SMODE), to select various signal modes (which will not be described herein), a serial clock input (SCLK), a chip select-Bar signal and a time domain/frequency domain select (TD-Bar) signal. The TD-Bar signal selects time domain operation when low and frequency domain operation when high. Serial output data is provided on an output line 1105 and serial input data is provided on an input line 1107. The serial output line 1105 provides serial output data (SOD) when the appropriate node is selected and the serial input line 1107 provides for receiving serial input data (SID), which is utilized to write to the internal control register 534 controlled by the control interface 535, as described hereinabove. In general, the operation of the serial interface 1103 is conventional and a representative description of such an interface is described in the data sheet DS 74F1 for the CS 5516 16-bit/20-bit Bridge Transducer A/D Converter manufactured by Cirrus Logic, which data sheet was copyrighted in 1997 and which is incorporated herein by reference. The serial interface 1103 provides for writing to the control register 544, which is a register for storing configuration information and command information. Overall, the functions carried out by the integrated circuit are effected through the use of an on-chip controller that manages the overall operation of the integrated circuit, and which functions are illustrated in the separate processing blocks. The on-chip controller incorporates various registers associated with the operation of the device. Typically, when power is applied, and the device has been reset via a reset input (not shown), the serial port 1107 is initialized into the command mode. In this mode, the integrated circuit is waiting to receive a control word via the serial port 1107. Whenever a new word is written into the configuration portion of the control register 534, the on-chip controller will then decode the word and execute the configure register instructions via the control interface 535. Typical configurations are such functions as adding offset, subtracting offset, providing a percentage of offset or selecting frequencies, placing the system in a sleep mode or taking it out of a sleep mode, calibrating the part, etc. These are all described in the data sheet for the CS 5516, in Table 2, all of which have been incorporated herein by reference. However, it should be understood that the CS 5516 is a time domain device and, therefore, additional information other than that set forth in the data sheet for the CS 5516 will be required for operation between the frequency domain and the time domain and also for configuration of the multiplexer 530. Other than these additional functions, the use of a configuration register and a command register in an overall control register in conjunction with the operation of the part is normally found in a time domain data converter, and is equally applicable to the frequency domain with additional functionality added.

Figure 11A:
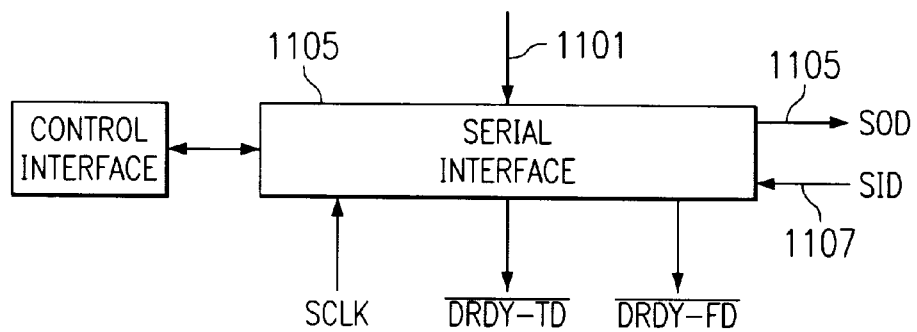
FIG. 11a illustrates a detail of the data-ready signal pins utilizing two pins, one for time domain and one for frequency domain.

Referring now to FIG. 11a, there is illustrated a modification of the embodiment of FIG. 11. In FIG. 11a, the serial interface 1105 provides two data-ready bar outputs, one for time domain, DRDY-TDb, and one for the frequency domain, DRDY-FDb. In this manner, a separate data-ready bar terminal is provided for indicating to a user whether the time domain output is ready or the frequency domain output is ready, then allowing the user to retrieve the appropriate information. Although illustrated as having a single serial output line 1105, the serial interface 1105 could actually provide for two separate serial outputs, one for the time domain and one for the frequency domain, as set forth hereinabove.

Figure 12:
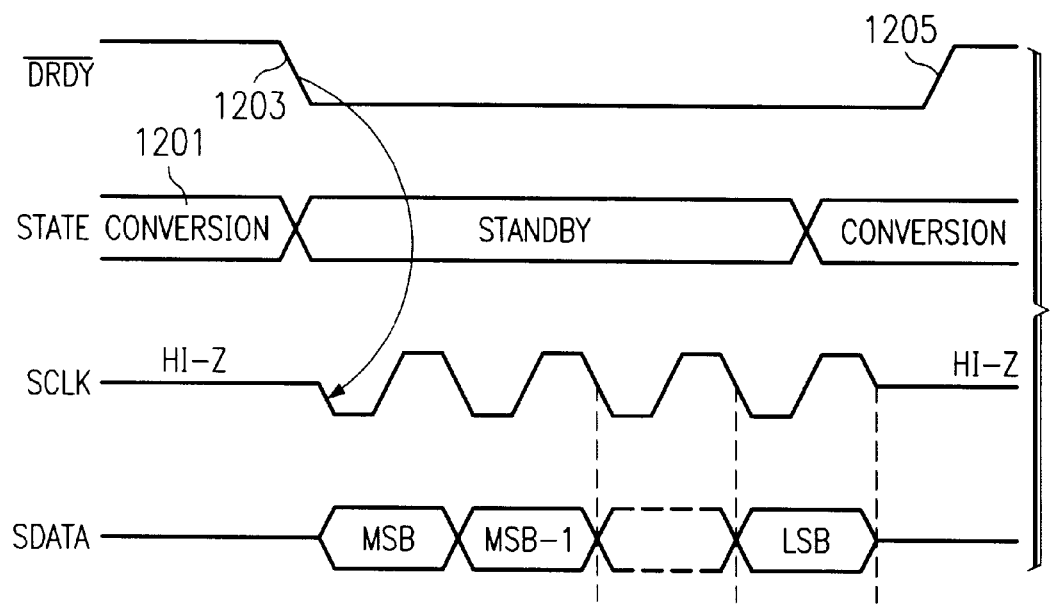
FIG. 12 illustrates a timing diagram for outputting a conversion result in the time domain.

Referring now to FIG. 12, there is illustrated a timing diagram for the operation of the serial interface 1103 in the time domain, i.e., whenever any information is extracted by the multiplexer 530 from the A/D converter 401, digital filter section 501 or the time domain process section 503. This is generally conventional as set forth in the data sheet for the CS 5505/6/7/8 A/D converter manufactured by Cirrus Logic, Inc., which data sheet was published in 1997 under Data Sheet DS 59F4, which is incorporated herein by reference. This part CS 5505 utilizes a serial interface logic which basically requires a chip-select signal (CS-Bar), a DRDYb signal, a serial clock and a serial data output. Specific reference is made to FIGS. 2, 3 and 4 therein.

Referring further to FIG. 12, there are provided two states during the time domain operation, a conversion state and a standby state. There could also be provided a calibration state, which is not illustrated. In general, whenever the conversion state is initiated, this being in response to a conversion pulse or some other input, a conversion operation is initiated. This conversion state, as noted, can be entered at the end of the calibration cycle, or whenever the converter is idle in the standby mode. The system can be set for a single conversion or can be set to perform continuous conversions on the input signal. Additionally, although not shown, there can be multiple inputs provided which can be selected by an input multiplexer (also not shown). There will be a predetermined number of clock cycles required for the conversion during a conversion time 1301. There may actually be two additional input clock cycles required, one initiating the conversion from the standby state and one as to when the conversion actually begins. This is due to internal logic aspects, which will not be described herein. At the end of a predetermined number of clock cycles required for the conversion, the DRDYb signal will go low at a transition 1303. This provides an indication that the serial port has been updated and the associated register has been written. It is important to note that, when the DRDYb signal goes low, the previous data in the serial port will be overwritten, this being from a previous conversion cycle. When the DRDYb signal goes low, this is recognized by the operating system which generates the serial clock on the SCLK input which then goes from a high impedance state to a low impedance state while clocking the data. This data is clocked out, such that all of the bits from the MSB to the LSB are clocked out of the serial point. At the end of the time provided for data to be clocked out, the DRDYb signal will go high in a transition 1305 and then wait for the end of the next conversion. It is noted that, during the serial output of the data, another conversion can take place. It is only important that all of the serial data be clocked out prior to the end of a given conversion cycle, such that the serial port register can be overwritten. Again, this is a conventional operation for the time domain.

Figure 13:
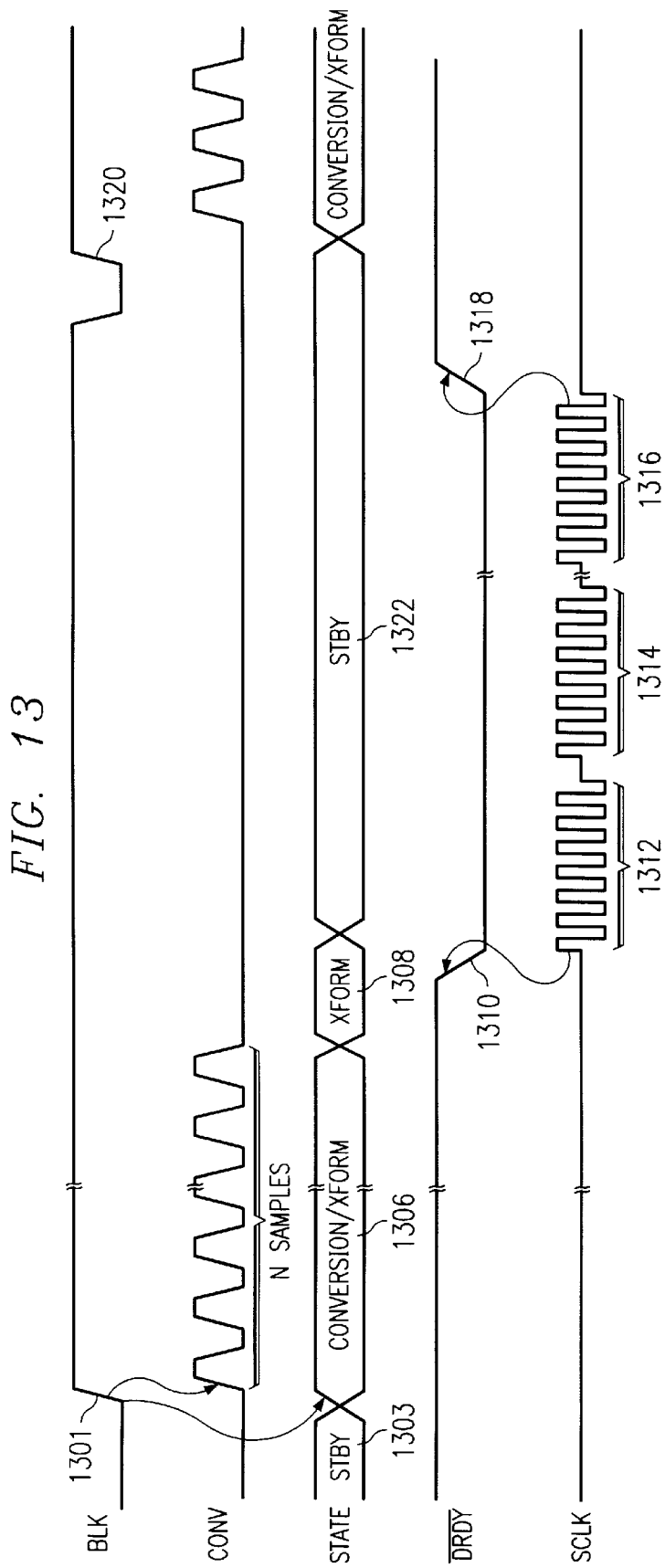
FIG. 13 illustrates one embodiment of a timing diagram for outputting data in the frequency domain utilizing the data-ready feature.

Referring now to FIG. 13, there is illustrated a flowchart depicting the use of the DRDYb signal with respect to conversion in the frequency domain. By comparison to the time domain, the frequency domain operation requires a conversion of a block of samples with the output thereof provided after complete conversion of a given block is completed. The system is initiated with a BLK signal going from a low to a high at a transition 1301. This initiates the conversion operation wherein N samples are acquired for a given block. This is initiated from the standby mode, as represented by a mode 1303 which then proceeds to a conversion/transform operation in a region 1306. The conversion/transform operation is one wherein analog data is converted to digital data and processed through the frequency domain transform algorithm. Typically, this transform operation can partially be carried out as each sample is converted to a digital word. However, at the end of the N samples, the conversion operation will cease and the remainder of the transform algorithm will be carried out. This is represented by a region 1308, which transform region basically represents a transform delay between the last sample and the completion of the entire transform. This transform region 1308 can include any post-transform operations, such as calculation of the magnitude. This, of course, is applica-tion specific, the important aspect being that the necessary calculations or computations be completed prior to providing an output therefrom.

At the end of the transform delay provided by the transform region 1308, the DRDYb signal is taken from a high to a low as represented by transition 1310. This will initiate the data-ready mode. In the data-ready mode, there will be a plurality of registers or "bins" that will contain information pursuant to the transform operation. Each of these data words must be read out in a serial manner through the serial port 1105. This will require the serial clock SCLK to clock the data for each of the available output digital values, as represented by a first digital value 1313, a second digital value 1314 and Mth word 1316, there being potentially a plurality of available output digital values therebetween. Of course, if only information regarding three bins was required, then only three digital values would be required for the output.

Once the final digital value has been output, the word 1316, the DRDYb signal will be raised high, as indicated by transition 1318. The next BLK rising edge will initiate collection of time samples for the next block. However, there is a standby region 1322 disposed between the transform region 1308 and the next conversion/transform operation. It may be that the next conversion cycle can be performed prior to reading out all of the data. This is due to the fact that the output will typically be double buffered. However, the only important fact is that the actual output register that is being read on the serial output port is not over written by result of the next transform operation. Any sequence of timing signals can be provided with various buffer outputs to provide a pipelining of these operations to minimize the time between one transform and the next. Further, it is noted that the timing diagram for FIG. 13 is not to scale and that the actual serial clocking of the data out from the serial interface 1103 can occur very rapidly in just a few sample times or even within a single sample time, such that the standby region 1322 is very small. The system can be set for a transformation of a single block (returning to standby mode when the block is completed) or can be set to acquire and transform blocks on a continuous basis.

Figure 14:
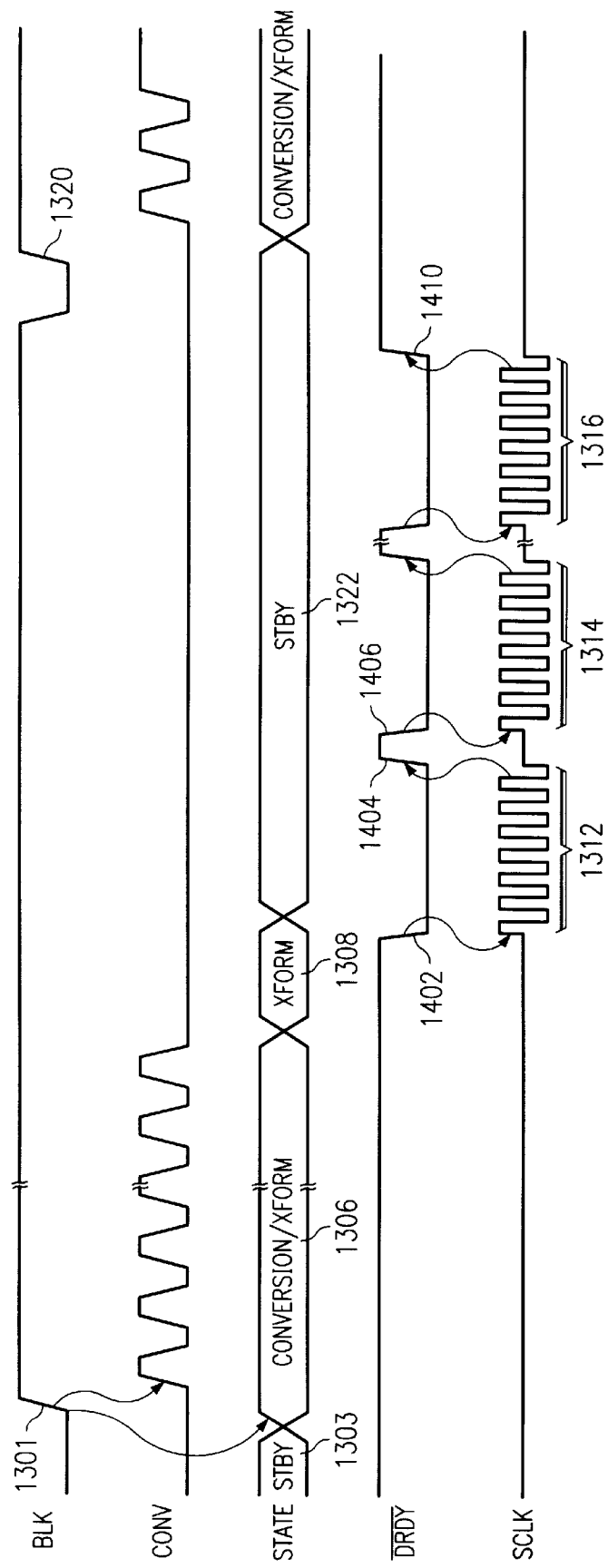
FIG. 14 illustrates an alternate embodiment to that of FIG. 13.

Referring now to FIG. 14, there is illustrated an alternate embodiment of the timing diagram of FIG. 13. In this embodiment, each of the data words is clocked out separately with the SCLK signal. Therefore, for the first data word, the data word 1312, a DRDYb transition 1402 initiates the clocking of the first word 1312 out from the output serial port 1105. The end of this serial output operation, the DRDYb signal is taken high, by transition 1404 and then low again by transition 1406 indicating the output of the next data word 1314. This will continue on until the last data word 1316, resulting in a transition 1410 of the DRDYb signal going high. This requires that the configuration register be pre-loaded with a predetermined list of desired frequency domain outputs. However, it should be understood that any combination of multiple data words for a given DRDYb transition and single words could be utilized. It is only necessary that this DRDYb transition occur after a complete transform operation has occurred. This operation will be provided primarily by the configuration controls wherein certain bits can be set in the configuration register.

Figure 15:
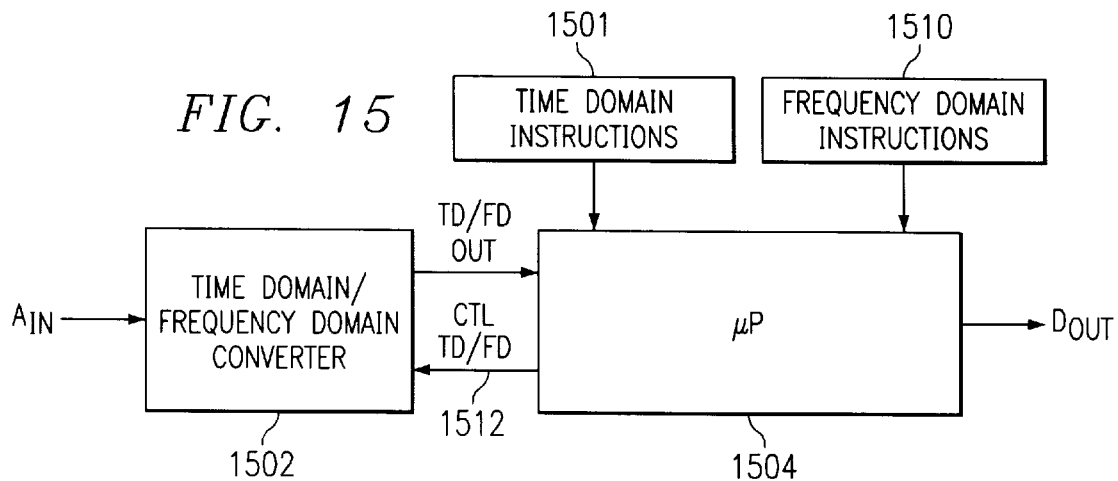
FIG. 15 illustrates a block diagram of a system interfacing the converter of the present disclosure with a microprocessor section.

Referring now to FIG. 15, there is illustrated an overall block diagram of the time domain/frequency domain converter, represented by a single integrated circuit 1502, interfaced with a microprocessor 1504. The microprocessor 1504 provides multiple functions, but it operates to receive either time domain information or frequency domain information. With time domain information output by converter 1502, certain instructions will be required which will be stored in a time domain instruction region 1506. This will allow the microprocessor 1504 to be configured such that time domain information is received from the converter 1502. When frequency domain information is received from the converter 1502, then frequency domain instructions in region 1510 will be utilized by the microprocessor 1504 in carrying out its functions.

In order to interface with the converter 1502, the microprocessor is provided with a control interface line 1512 which will allow information to be transmitted to the time domain/frequency domain converter to select the mode of operation, i.e., operating in the time domain or operating in the frequency domain. This can be facilitated in a number of a ways. First, a configuration word can be loaded into the configuration register after a reset operation has been initiated of the converter 1502. This could be a bit that sets it in one or the other of the domains. Further, this control in the form of one or more configuration bits can set the state of the multiplexor 530 such that not only is the frequency domain or the time domain selected, but also the operation, i.e., it could be that the microprocessor 1504 would desire some post processing in the frequency domain as opposed to just merely examining certain bins. This could be selected therebetween. Further, in the time domain, the output of the A/D converter section 401 could be selected or the output of the digital filter section 501. This is merely selected by the configuration setting. Further, this control line 1512 could be a single input or single pin that could be pulled high or low for selecting the operation. This is illustrated in FIG. 11 wherein the serial interface 1103 has a single input TD-Bar. When high, the frequency domain is selected and, when low, the time domain is selected. It is noted that the microprocessor 1504 requires programming to allow the versatility of selecting this operation. Further, it can be seen that this is done with a single interface in the form of either a serial output for loading a configuration register or just a single pin. Of course, the microprocessor 1504 would need to interface with the converter 1502 in the frequency domain to provide other information such as the block start, which would not be required in the time domain.

Figure 16:
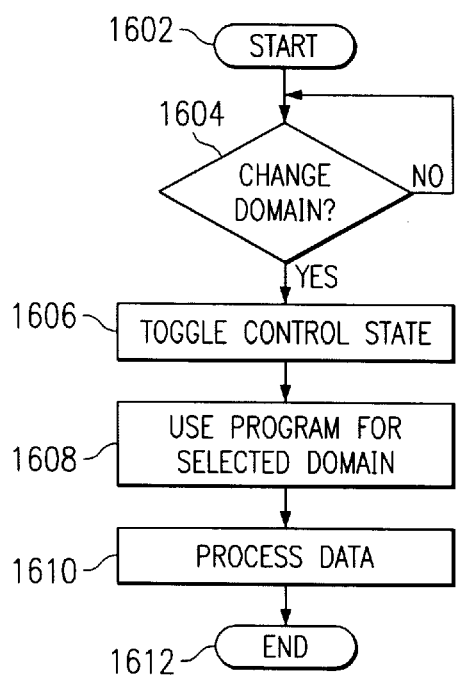
FIG. 16 illustrates a flowchart depicting the operation of changing from a time domain to a frequency domain operation.

Referring now to FIG. 16, there is illustrated a flowchart depicting the operation of the microprocessor for changing between modes. The program is initiated at a start block 1602 and then proceeds to a decision block 1604 to determine if the domain is to be changed between the time domain and frequency domain. If not, the program loops back upon itself and, if so, the program flows to a function block 1606 to toggle the control state and then to a function block 1608 to use the particular program instructions for the selected feature and the selected domain. The program then flows to a function block 1610 to process the data in accordance with the selected domain and the selected instructions and into an End block 1612.

Figure 17:
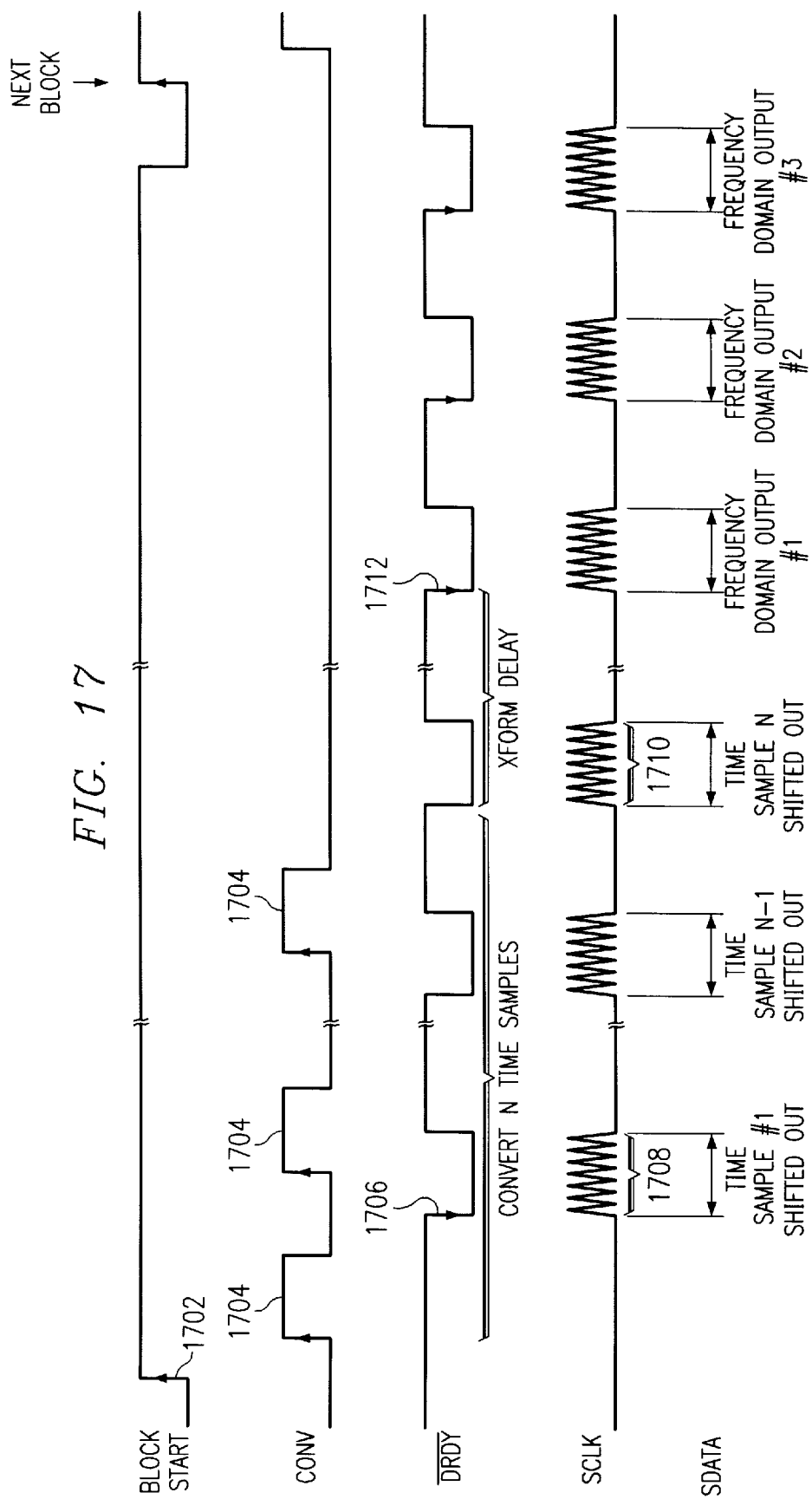
FIG. 17 illustrates a timing diagram for retrieving both time samples and frequency domain information during a single conversion/transform operation.

Referring now to FIG. 17, there is illustrated a timing diagram for an alternate embodiment of the present disclosure. In the embodiment of FIG. 17, the time samples from the time domain processor 403 and the frequency domain output from the frequency domain processor 415 can be selected therebetween. During the data conversion operation in the time domain, time samples are output as digital values in a continuous manner. A block of N time samples is defined from a BLK starting point and these N time samples operated on by the time domain/frequency domain transform block 415 to generate the frequency domain values which, as described hereinabove for N=1024, could be up to 1024 digital values for the 1024 bins. However, this frequency domain information is not present until the transform is complete, which occurs after receipt of all N time samples, although partial transforms can be performed at the receipt of each time sample.

In the embodiment illustrated in FIG. 17, during the transform operation, the resultant digital value of the conversion operation for each time sample can continually be shifted out, up to the resultant digital value of the conversion operation for the Nth time sample. Once the resultant digital values of the conversion operation for all the time samples have been shifted out, then the frequency domain information resulting from the transform operation operating on the block of N time samples can be shifted out, these values depending upon the transform algorithm, the amount of postprocessing performed, etc.

With specific reference to FIG. 17, the block start signal BLK is initiated at an edge 1702 and then the conversion begins with the data samples 1704 output for the N time samples. These time samples are processed by the time domain/frequency transform 415, which will be complete a predetermined transform delay after the last of the N time samples in the block has been received. When the conversion results for each of the time samples processed is complete after the block start signal has gone high at edge 1702 (or for select one of the time samples in the block), the DRDYb signal goes low at edge 1706 to indicate that the information associated with the results of the conversion operation on the first time sample 1704 is ready for output and the serial clock SCLK is allowed to retrieve the data. This will result in a serial clocking operation during a period 1708 associated with the first time sample. This will result in the results of the conversion operation for the first time sample being shifted out. Of course, this value is also being input to the time domain/frequency domain transform block 415. This continues for all time samples up to the Nth time sample at a serial clock period 1710 (or the results for only conversion operations on select time samples in the block can be output). After the results of the conversion operation for the last time sample has been shifted out, there will be a transform delay followed by the DRDYb line on low, as indicated by transition 1712. This will indicate that the frequency domain information is ready for output. The SCLK line will then be clocked wherein the data for the first frequency domain output value will be output, followed by the remaining frequency domain output values, there only being shown three frequency domain output values for exemplary purposes. Also the DRDYb signal is illustrated as going low for each bin output or frequency domain output value, it being understood that the DRDYb line could go low once for all of the frequency domain output values, the user then generating timing for the SCLK signal to sequentially output all of the appropriate information. It is important that the DRDYb signal provide information that can be utilized for both time domain and frequency domain information and that the multiplexer 530 can provide time domain information during periods when the time domain processor is processing the information, without interfering with the operation of the either operation through the appropriate internal data buffering.

Figure 18:
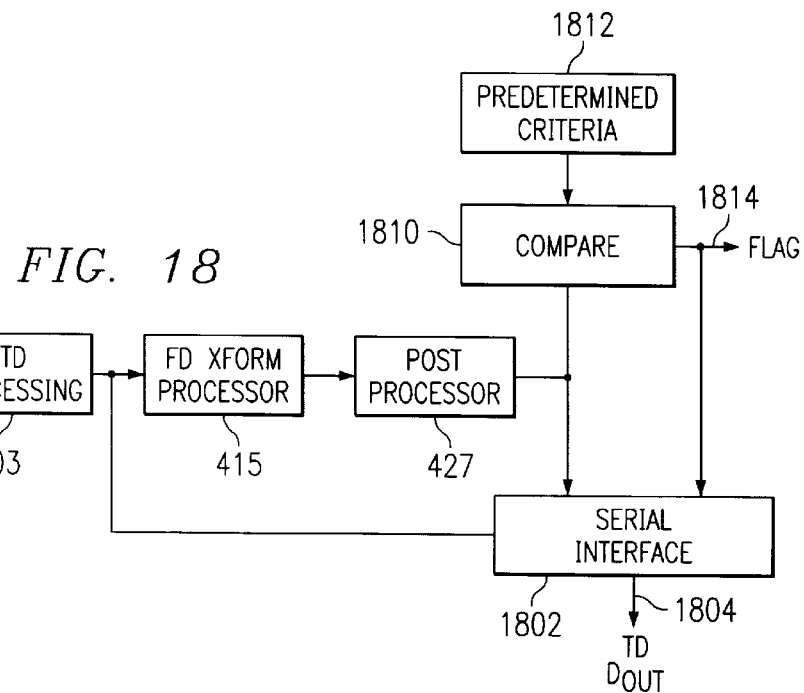
FIG. 18 illustrates an alternate embodiment of the disclosure for utilizing frequency domain processing in the background.

FIG. 18 illustrates an alternate embodiment of the present disclosure. In this embodiment, the A/D converter 401 and the time domain digital processing section 403 are operable to perform whatever processing is necessary in the time domain, as described hereinabove. This could involve any amount of post processing operations on the converted data in the time domain, these being the time sample data.

Information in the time domain is output through a serial interface block 1802 to a serial output 1804. In general, this embodiment is a time domain data converter. However, the frequency domain transform processor 415 is included on the integrated circuit for the purpose of providing some predetermined background function in the frequency domain. One exemplary background function is to monitor a 6 Hz frequency component in the analog input signal, compare the magnitude of this component to an acceptable 60 Hz interference threshold, and then provide an error flag if the interference exceeds the threshold. The frequency domain interference monitor can run continuously in the background and concurrently with the normal operation of the time domain converter. The monitor is provided by the post processor 427.

The post processor 427, as described hereinabove, can perform any type of operations on the frequency domain information output by the transform processor 415 for a defined block of N time samples of the data being processed by the time domain processor 403. For illustrative purposes, all the clocks and control blocks have not been described in the Figure, they having been described hereinabove. This post processor 427 is operable to perform the predetermined post processing and generate some type of result in the frequency domain. This frequency domain result can be compared with a comparator 1810 with some type of pre-determined criteria, which is pre-stored in a block 1812. This compare operation can generate a flag on a possible output pin 1814 from the integrated circuit or this can be sent back to the serial interface to control the serial interface to output the results of the post processor 427. This can be an interrupt-driven function wherein the flag provides an interrupt and then the data from the post processor 427 is read out. In the disclosed embodiment, the transform processor 415 is not operable to provide frequency domain output information as the primary function of the integrated circuit.

Figure 19A:
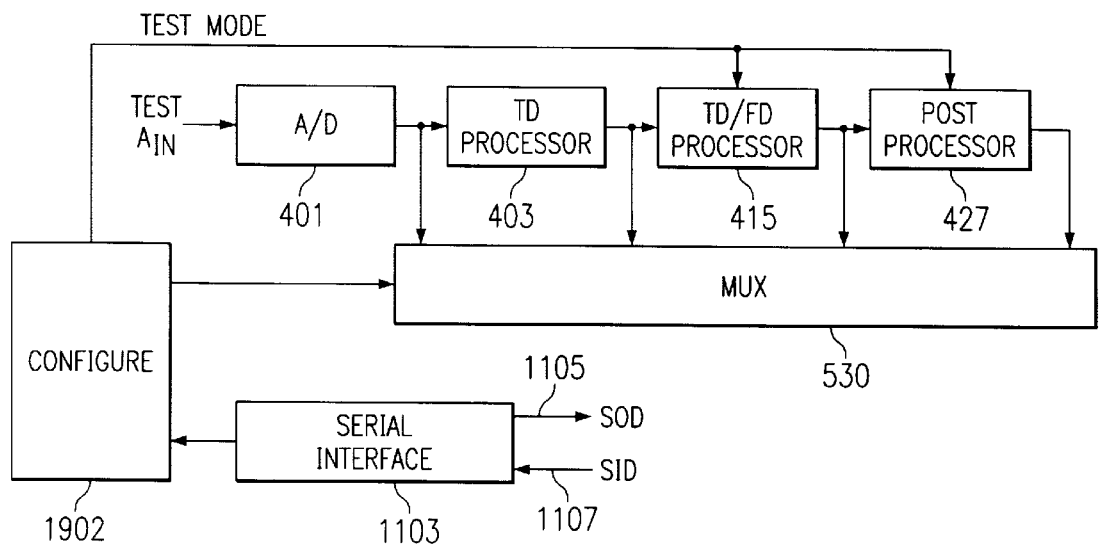
FIGS. 19a and 19b illustrate embodiments for a test mode feature.

The frequency domain processor 415 may also be included on the integrated circuit for the purpose of providing a test mode for measuring the non-linearity of the A/D converter 401. In such a test mode, a distortion free sine wave is provided as the analog input to the integrated circuit, with harmonic distortion components monitored in the frequency domain. Defective integrated circuits with unacceptable distortion levels can be easily rejected utilizing such a test mode. Referring now to FIG. 19*a*, there is illustrated a simplified block diagram illustrating the test mode concept. In FIG. 19*a*, the integrated circuit is configured for both time domain operations and frequency domain operations. The various processing sections, the time domain processor 403, time domain/frequency domain processor 415 and post processor 427, are all interfaced with the serial interface 1103. In addition, there is provided a configuration block 1902, which represents the control interface 535 and control register 534, which is interfaced with the serial interface 1103. The configuration block 1902, in addition to controlling the multiplexer 530, also provides test mode control for the time domain/frequency domain processor 415 and post processor 427. When the system is not in test mode, the operation is as described hereinabove, i.e., there is information input thereto and digital information output therefrom in one of the select processing sections. However, in the test mode, the configuration block 1902 is operable to control the system to operate the frequency domain transform portion thereof in a particular test mode operation. As described in the example above, this could be utilized for measuring distortion. In this mode, there will be some type of control associated therewith to place the system in the test mode.

This could be in the form of a configuration bit that is set in the configuration block 1902, in the control register 534 (not shown), which sets the test mode operation. Once in test mode, then a test analog input is applied thereto (such as a sine wave of a predetermined frequency) and the results stored in the control register 534 for later retrieval therefrom. Typically, this test mode is something that would be performed at the manufacturer's location and would basically be a "hidden instruction" as it applies to a user, i.e., it is not a documented test. However, this mode is a mode whereby the transform operation is a pre-determined and defined operation for primarily one purpose. It may be that the distortion is measured by comparing a fundamental frequency in one bin to the second and/or third harmonic level in another bin to measure distortion. Since the frequency of the sine wave is known, it is only necessary to examine a limited number of frequency bins in order to make a decision. There can be provided a comparator or some type of post processing operation in the post processor 427 primarily for the test mode such that the system need only set the bit in the control register for reading thereof, i.e., indicating fail or pass. Alternatively, the information could be extracted out of the post processor 427 with the multiplexer 530, in order to read a test result value. Once the test mode has been entered and the test performed, then the control bit can be set back to normal operating mode during chip test.

Figure 19B:
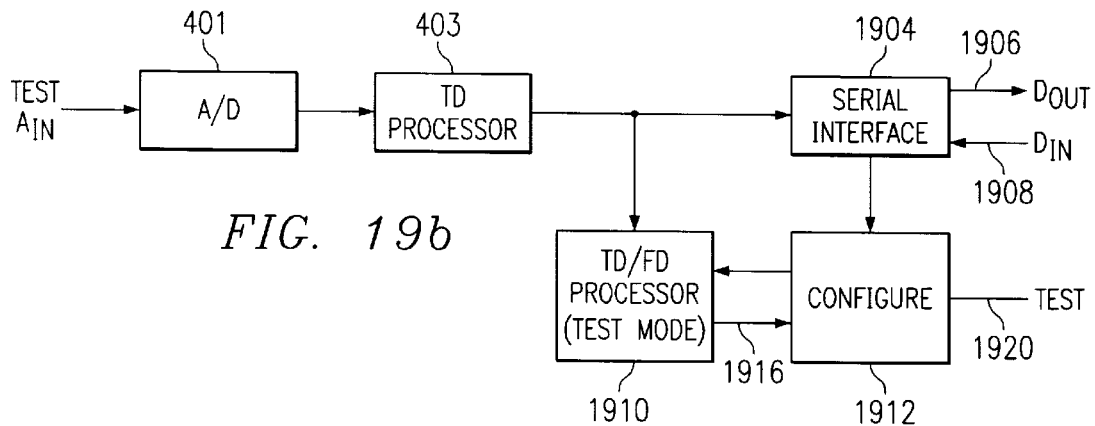

Referring now to FIG. 19*b*, there is illustrated an alternate embodiment wherein the integrated circuit is primarily utilized for time domain operations. As such, the A/D converter 401 feeds the time domain processor 403, which can perform a process such as a digital filtering operation, and then provide this result in the time domain for output to the serial interface block 1904, similar to the interface block 1103. This will provide a digital output in the time domain and allow for digital input on lines 1906 and 1908, respectively. The serial interface block 1904 is primarily utilized to retrieve information from the time domain processor 403 after the conversion operation in the time domain. However, there is provided a test mode wherein a separate time domain/frequency domain processor along line 910 is provided which is operable to perform a single task, that of obtaining frequency domain information for a test operation. In this operation, as described hereinabove, in the example, a defined sine wave is input to the AID converter 401 and then a distortion analysis performed. The time domain/ frequency domain processor 1910 can be utilized at any time as it is a "background" processor. A configuration block 1912, similar to the configuration block 1902 in FIG. 19*a*, is provided which receives information from the input port 1908 to the serial interface block 1904 (or this can be an external pin that could be pulled high or low indicating a test mode) that allows a bit in the control register 534 to be set. Once set, this places the time domain/frequency domain processor into an operational mode, i.e., provides a block start signal, processes the information output by the time domain processor 403 and then generates a result. The processor 1910 can also do post processing such that only a single result is output on a line 1916 for input to the configuration register 1912 as a single bit. In this manner, there is provided a separate background processor for performing a single frequency domain function wherein time domain information is converted to the frequency domain to extract information in the frequency domain therefrom. This requires a predefined signal being input thereto and the time domain/frequency domain processor 1910 being rendered operational. This could always be an operating mode wherein the block start signal is continually generated, as this operation can be performed continually in the background. However, a user would typically want to disable this due to the power considerations.

In an alternate embodiment in FIG. 19b or FIG. 19a, there can be provided a test pin, which is only shown with reference to FIG. 19b. This test pin is referenced by a line 1920, which is an external pin that can be raised high or low with the configuration block 1912 recognizing such. Further, the time domain/frequency domain processor 1910, when operating, either in response to a configuration bit in the control register 534 for test mode or in a continuous manner, could provide an output on the test pin 1920 wherein the test pin would provide an output as opposed to receive an input control signal. Therefore, if a user inputs the test signal on the analog input, they need only examine the state of the test pin 1920 in order to determine if there is acceptable distortion. Other than the test mode, there would be no reason to utilize the test pin 1920. However, the preferred operation would be to run the test mode in the background only for the purposes of testing the chip during manufacturing, this being a non-disclosed function to the user.

Figure 20:
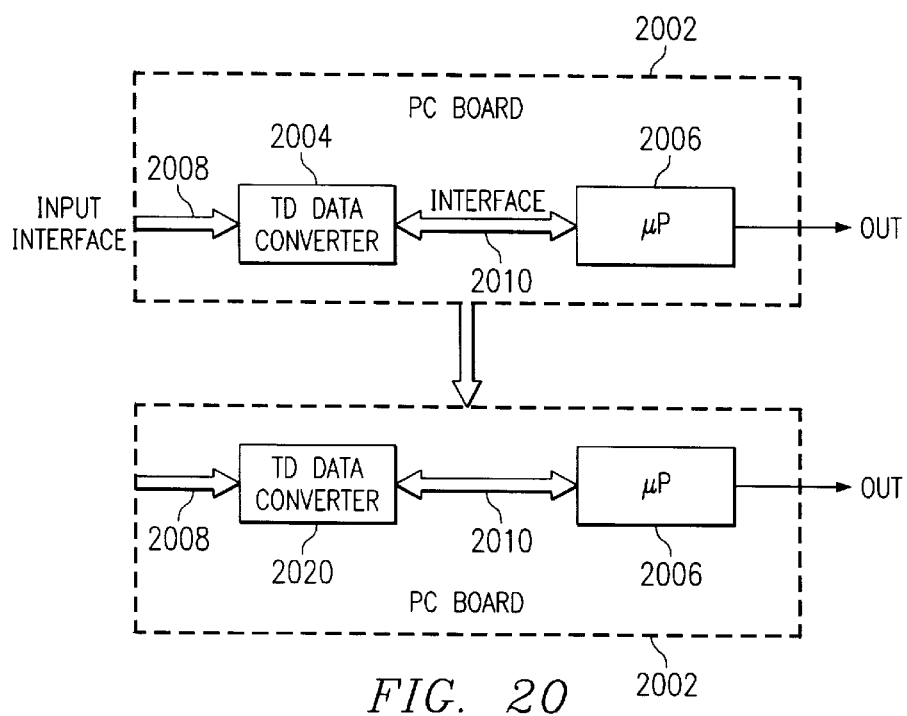
FIG. 20 illustrates a diagrammatic view of the board compatible operation between the time domain and the frequency domain data converter.

Referring now to FIG. 20, there is illustrated a block diagram of an alternate embodiment of the present disclosure illustrating a board compatible configuration wherein a time domain data converter and a time domain/frequency domain data converter can be interchanged with the a common microprocessor. In the upper portion of the diagram, there is provided a PC board 2002, which PC board 2002 has associated therewith various circuitry and interconnects for receiving integrated circuits. There are provided two integrated circuits, a first integrated circuit 2004 and a second integrated circuit 2006. The first integrated circuit is a data converter integrated circuit. In the upper portion, the integrated circuit 2004 is a time domain data converter. It is operable to receive an input analog signal, convert it to a digital data signal in the time domain for output therefrom. This integrated circuit 2004 has a particular pin configuration that interfaces with the various "traces" or interconnects on the PC board 2002 which allow each of the pins on the integrated circuit (not shown) to be interconnected to such things as ground, power supply voltages, control signals and the such. The integrated circuit 2004 is interfaced with input circuitry through an input interface 2008, which input interface allows control signals, if necessary, to be input to the integrated circuit 2004, and analog input terminals to receive analog input signals, which can be a single ended input or double ended input, and other necessary interface signals.

The data converter integrated circuit 2004 is operable to interface with the integrated circuit 2006 through an interface 2010, which is illustrated as a bus. However, this bus is operable to provide data lines from the integrated circuit 2004 to the integrated circuit 2006, data lines in the reverse direction and also for control lines from the integrated circuit 2006 to the integrated circuit 2004. There also can be provided control lines or indicator outputs from the integrated circuit 2004 to the integrated circuit 2006 that do not constitute a data input but, rather, are commands and control lines. This, of course, depends upon the functionality of the integrated circuit 2004.

The integrated circuit 2006 is a microprocessor, this microprocessor having contained therein instruction code that allows it to operate in a predetermined manner. Typically, these microprocessors will have a certain "form" or pin configuration that allows it to interface with the PC board 2002. Typically, the processing capability of a microprocessor 2006 is such that there will be provided some limitations thereto. If additional processing capability is required, typically this will require a different chip with a different pin configuration, i.e., not board compatible. Therefore, the configuration of the PC board 2002 in the upper portion with the time domain data converter, comprising the integrated circuit 2004, and the microprocessor, comprising the integrated circuit 2006, provide a time domain operation wherein the microprocessor is operable to operate on the time domain output information from the data converter 2004. The microprocessor is configured such that it can control the data converter to retrieve information therefrom, possibly input configuration data thereto and the such. This is a conventional operation.

Referring further to FIG. 20, there is illustrated in the lower portion thereof the second configuration. This configuration is such that it utilizes the same PC board 2002 but it utilizes a different integrated circuit 2020 in place of the integrated circuit 2004. However, since the same PC board 2004 is utilized, the upper board configuration and the lower board configuration are identical; that is, there are no required changes to the physical board between utilizing the integrated circuit 2004 and the integrated circuit 2020 in order to interface with any of the circuitry or interconnections on the PC board 2002. Further, the microprocessor in the integrated circuit 2006 can be identical for both the upper and lower configurations with integrated circuits 2004 and 2010 being the only difference as to the different parts utilized, to provide a different functionality without requiring a different board layout. The input interface 2008 is also board compatible. However, the microprocessor could be a faster circuit, but it must be pin-compatible, such that it will replace the slower processor without requiring a re-layout of the PC board 2002. Also, the microprocessor in integrated circuit 2006 is reprogrammed to operate on the frequency domain information as opposed to the time domain information in the lower configuration. If any control signals are required to interface with the time domain/frequency domain data conversion functionality as compared to that of the time domain data conversion functionality, these control lines exist between the microprocessor and the integrated circuit position occupied by either the integrated circuit 2004 or the integrated circuit 2020; that is, there are provided compatible pins on each of the integrated circuits 2004 and 2020 for interconnection to the microprocessor in integrated circuit 2006. Therefore, no alterations are required on the PC board 2002 in order to allow interface to either the time domain conversion functionality or the time domain /frequency domain data conversion functionality. In such a manner, the designer now has an design wherein the two integrated circuits 2004 and 2020 are "board compatible." This board compatibility allows the user to insert a data converter that either outputs time domain information only or both time and/or frequency domain information, both receiving an analog input on the input, for a compatible input pin. The microprocessor in the integrated circuit 2006 need not be exchanged but, rather, need only be reprogrammed to receive the information. For example, if both of the data converters in integrated circuit 2004 and 2020 provide a single output, the microprocessor in integrated circuit 2006 would only recognize one or the other for a given set of program instructions. However, since the data converters are board compatible and provide a single output interfaced between the board compatible integrated circuit and the integrated circuit 2006, only a programming change is required in the microprocessor. Programming is not required in microprocessor to receive the time domain information and then process it through a time domain/ frequency domain transform algorithm in order to provide a frequency domain functionality, but, rather, this functionality is transferred over to the data converter integrated circuit. By shifting the processing requirements for this transform to the data converter integrated circuit and providing a common interconnection between an already existing microprocessor and a data conversion operation, more functionality is provided to the user.

Although the preferred embodiment has been described in detail, it should be understood that various changes, substitutions and alterations can be made therein without departing from the spirit and scope of the invention as defined by the appended claims.

What is claimed is:

1. A data converter for converting data from an analog input value to a digital value, comprising:
    a time domain processor for receiving the analog input value and generating a digital value representative thereof in the time domain;
    a frequency domain processor for receiving the output of said time domain processor and processing the time domain information therefrom through a predetermined time domain/frequency domain algorithm to output frequency domain information representative of the output of the time domain processor in the frequency domain in accordance with said algorithm;
    an input/output interface for interfacing the output of at least said frequency domain processor for external access thereto; and
    a controller for generating a frequency domain data-ready signal when data is generated by said frequency domain processor to indicate to a user that data can be retrieved from said input/output interface.

2. The data converter of claim 1, wherein said controller is further operable to generate a time domain data-ready signal when data is ready to be output from said time domain processor and wherein said input/output interface is operable to selectively interface with said time domain processor for external access thereto.

3. The data converter of claim 2, wherein said input/output interface is operable to provide the output of said frequency domain processor on a first output and the output of said time domain processor on a second output.

4. The data converter of claim 2, wherein said time domain data-ready signal is output on a first output and said frequency domain data-ready signal is output on a second output.

5. The data converter of claim 2, wherein said time domain data-ready signal and said frequency domain data-ready signal are output on the same output, which output is multiplexed by said controller.

6. The data converter of claim 2, wherein said input/output interface includes a multiplexer, which said multiplexer is operable to select for output for external access thereto the output of either said time domain processor or said frequency domain processor on a common serial output port, and wherein said controller is operable to generate said time domain or said frequency domain data-ready signal to indicate when data is ready to be output in accordance with the one of said time domain processor output or said frequency domain processor output selected by said multiplexer.

7. The data converter of claim 6, wherein said controller is operable to generate said data ready signal as a time domain data ready signal when data is generated by said time domain processor and a frequency domain data ready signal when frequency domain information is generated by said frequency domain processor, said input/output interface operable to interface the output of said time domain processor for external access thereto when said time domain data ready signal is generated and the output of said frequency domain processor for external access thereto when said frequency domain data ready signal is generated.

8. The data converter of claim 6, wherein said time domain data-ready signal and said frequency domain data-ready signal are output on a common output, which output is multiplexed by said controller.

9. The data converter of claim 6, wherein said time domain data-ready signal is output on a first output and said frequency domain data-ready signal is output on a second output from the data converter.

10. The data converter of claim 1, wherein said time domain processor outputs digital values at a predetermined sample rate to the input of said frequency domain processor, which said frequency domain processor operates on a block of said digital values output by said time domain processor of a predetermined block size containing a predetermined number of said digital values output by said time domain processor.

11. The data converter of claim 10, wherein the operation of said frequency domain processor is initiated in response to receiving a block start signal at the beginning of said block of digital values output by said time domain processor.

12. The data converter of claim 10, wherein said controller is operable to generate said frequency domain data-ready signal after said block of said digital values output by said time domain processor is processed by said frequency domain processor.

13. The data converter of claim 1, wherein said time domain processor comprises an analog-to-digital converter for receiving the analog input value and converting it to a digital value in the time domain.

14. The data converter of claim 1, wherein said input/output interface comprises a serial interface.

15. A data converter for converting an analog input to a digital output, comprising:
    a time domain data converter for receiving the analog input, and converting the received analog input to digital values;
    an input/output interface for interfacing the output of said time domain converter for external access thereto; and
    a background frequency domain processor for receiving a plurality of successive outputs of said time domain data converter for processing with a predetermined time domain/frequency domain algorithm to provide frequency domain information relating to the successive outputs of said time domain data converter processed thereby.

16. The data converter of claim 15, wherein said time domain data converter includes an analog-to-digital converter operating at a predetermined sample rate and said frequency domain processor is operable to operate on a block of a predetermined number of time domain samples.

17. The data converter of claim 15, wherein said background frequency domain processor is operable to provide a dedicated output from the data converter indicative of the results of processing of the received plurality of successive outputs of said time domain data converter.

18. The data converter of claim 15, wherein said background frequency domain processor provides an output which is interfaced through said input/output interface for access by a user.

19. The data converter of claim 15, wherein said background frequency domain processor operates in a first enable mode to receive and process said plurality of successive outputs of said time domain converter and in a second and disable mode for not processing or receiving outputs of said time domain data converter, and further comprising enabling means for switching said background frequency domain processor between said first enable mode and second disable mode.

20. The data converter of claim 19, wherein said means for enabling operates in response to an external signal received therefrom.

21. The data converter of claim 20, wherein the data converter is comprised of a self-contained integrated circuit with a plurality of input/output pins, power supply pins and control pins and wherein at least one of said pins is a dedicated pin associated with said external signal.

22. The data converter of claim 21, wherein said dedicated pin is associated with first and second logic states, with said first logic state associated with said first enable mode and second logic state associated with said second disable mode.

23. The data converter of claim 19, wherein said first enable mode comprises a test mode wherein said predetermined time domain/frequency domain algorithm is operable to perform a predetermined test on the time domain digital values output by said time domain data converter to provide test information in the frequency domain on the frequency domain output.

24. The data converter of claim 23, wherein said test mode results output by said background frequency domain processor are stored in an internal register in the data converter and wherein said input/output interface is operable to allow external access to said internal register.

25. A method for converting data from an analog input value to a digital value, comprising the steps of:
inputting the analog input value to a time domain processor and generating a digital value representative thereof in the time domain;
connecting the output of the time domain processor to a frequency domain processor and processing the time domain information therefrom through a predetermined time domain/frequency domain algorithm with the frequency domain processor to output frequency domain information representative of the output of the time domain processor in the frequency domain in accordance with the algorithm;
interfacing the output of at least the frequency domain processor through an input/output interface to an external location for external access thereto; and
generating with a controller a frequency domain data-ready signal when data is generated by the frequency domain processor to indicate to a user that data can be retrieved from the input/output interface.

26. The method of claim 25, wherein the step of generating is further operable to generate a time domain data-ready signal when data is ready to be output from the time domain processor and wherein the input/output interface is operable to selectively interface with the time domain processor for external access thereto.

27. The method of claim 26, wherein the step of interfacing is operable to provide the output of the frequency domain processor on a first output and the output of the time domain processor on a second output.

28. The method of claim 26, wherein the time domain data-ready signal is output on a first output and the frequency domain data-ready signal is output on a second output.

29. The method of claim 26, wherein the time domain data-ready signal and the frequency domain data-ready signal are output on the same output, which output is multiplexed by the step of generating.

30. The method of claim 26, wherein the step of interfacing includes the step of multiplexing with a multiplexer to select for output for external access thereto the output of either the time domain processor or the frequency domain processor on a common serial output port, and wherein the step of generating is operable to generate the time domain or the frequency domain data-ready signal to indicate when data is ready to be output in accordance with the one of the time domain processor output or the frequency domain processor output selected by the multiplexer.

31. The method of claim 30, wherein the step of generating is operable to generate the data ready signal as a time domain data ready signal when data is generated by the time domain processor and a frequency domain data ready signal when frequency domain information is generated by the frequency domain processor, the step of interfacing is operable to interface the output of the time domain processor for external access thereto when the time domain data ready signal is generated and the output of the frequency domain processor for external access thereto when the frequency domain data ready signal is generated.

32. The method of claim 30, wherein the time domain data-ready signal and the frequency domain data-ready signal are output on a common output, which output is multiplexed by the step of generating.

33. The method of claim 30, wherein the time domain data-ready signal is output on a first output and the frequency domain data-ready signal is output on a second output.

34. The method of claim 25, wherein the step of processing with the time domain processor outputs digital values at a predetermined sample rate to the input of the frequency domain processor, which frequency domain processor operates on a block of the digital values output by the time domain processor of a predetermined block size containing a predetermined number of the digital values output by the time domain processor.

35. The method of claim 34, wherein the step of processing with the frequency domain processor is initiated in response to receiving a block start signal at the beginning of the block of digital values output by the time domain processor.

36. The method of claim 34, wherein the step of generating is operable to generate the frequency domain data-ready signal after the block of the digital values output by the time domain processor is processed by the frequency domain processor.

37. The method of claim 25 wherein the step of processing with the time domain processor includes the step of processing the received analog input value with an analog-to-digital converter and converting it to a digital value in the time domain.

38. The method of claim 25, wherein the input/output interface comprises a serial interface.

39. A method for converting an analog input to a digital output, comprising the steps of:
receiving the analog input, and converting the received analog input to digital values with a time domain data converter;
for interfacing the output of the time domain converter through an input/output interface for external access thereto; and
for receiving a plurality of successive outputs of the time domain data converter and processing the received outputs through a background frequency domain processor with a predetermined time domain/frequency domain algorithm to provide frequency domain information relating to the successive outputs of the time domain data converter processed thereby.

40. The method of claim 39, wherein the time domain data converter includes an analog-to-digital converter operating at a predetermined sample rate and the frequency domain processor is operable to operate on a block of a predetermined number of time domain samples.

41. The method of claim 39, wherein the step of processing with the background frequency domain processor is operable to provide a dedicated output indicative of the results of processing of the received plurality of successive outputs of the time domain data converter.

42. The method of claim 39, wherein the background frequency domain processor provides an output which is interfaced through the input/output interface for access by a user.

43. The method of claim 39, wherein the step of processing with the background frequency domain processor operates in a first enable mode to receive and process the plurality of successive outputs of the time domain converter and in a second and disable mode for not processing or receiving outputs of the time domain data converter, and further comprising the step of switching the background frequency domain processor between the first enable mode and second disable mode.

44. The method of claim 43, wherein the step of switching operates in response to an external signal received therefrom.

45. The method of claim 44, wherein the data converter is comprised of a self-contained integrated circuit with a plurality of input/output pins, power supply pins and control pins and wherein at least one of the pins is a dedicated pin associated with the external signal.

46. The method of claim 45, wherein the dedicated pin is associated with first and second logic states, with the first logic state associated with the first enable mode and second logic state associated with the second disable mode.

47. The method of claim 43, wherein the first enable mode comprises a test mode wherein the predetermined time domain/frequency domain algorithm is operable to perform a predetermined test on the time domain digital values output by the time domain data converter to provide test information in the frequency domain on the frequency domain output.

48. The method of claim 47, wherein the test mode results output by the background frequency domain processor are stored in an internal register and wherein the step of interfacing is operable to allow external access to the internal register.

* * * * *